(12) United States Patent
Lorenz et al.

(10) Patent No.: US 11,117,798 B2
(45) Date of Patent: Sep. 14, 2021

(54) MEMS-SENSOR

(71) Applicant: Infineon Technologies AG, Neubiberg (DE)

(72) Inventors: Gunar Lorenz, Munich (DE); Alfons Dehe, Villingen Schwenningen (DE); Marc Fueldner, Neubiberg (DE); Bernd Goller, Otterfing (DE); Ulrich Krumbein, Rosenheim (DE); Andreas Wiesbauer, Poertschach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/270,219

(22) Filed: Feb. 7, 2019

(65) Prior Publication Data
US 2019/0270639 A1  Sep. 5, 2019

(30) Foreign Application Priority Data

Mar. 1, 2018 (DE) .......................... 102018203098.7

(51) Int. Cl.
*H01L 29/84* (2006.01)
*B81B 7/00* (2006.01)
(Continued)

(52) U.S. Cl.
CPC .............. *B81B 7/0064* (2013.01); *B81B 3/00* (2013.01); *B81B 3/0018* (2013.01); *B81B 7/008* (2013.01); *B81B 7/02* (2013.01); *G01L 9/00* (2013.01); *H04R 1/023* (2013.01); *H04R 19/04* (2013.01); *B81B 2201/0257* (2013.01); *B81B 2203/0127* (2013.01); *B81B 2203/04* (2013.01);
(Continued)

(58) Field of Classification Search
CPC .... H81B 3/0018; H81B 7/0064; H81B 7/008; H81B 7/02; H04R 19/04; H04R 1/023; H04R 2201/003; B81B 2201/0257; B81B 2203/0127; B81B 2203/04; B81B 2207/091; B81B 2207/11; B81B 3/00; B81B 3/0018; B81B 7/0064; B81B 7/008; B81B 7/02
See application file for complete search history.

(56) References Cited

U.S. PATENT DOCUMENTS 5,101,543 A * 4/1992 Cote ...................... H01G 7/023
29/25.41
6,512,833 B2 * 1/2003 Himori ................ H04R 19/016
381/174
(Continued)

FOREIGN PATENT DOCUMENTS

DE          10303263 A1    8/2004
DE     102005053765 A1    5/2007
(Continued)

*Primary Examiner* — Jay C Kim
(74) *Attorney, Agent, or Firm* — Slater Matsil, LLP

(57) ABSTRACT

A MEMS sensor includes a housing with an interior volume, wherein the housing has an access port to the interior volume, a MEMS component in the housing, and a protection structure, which reduces an introduction of electromagnetic disturbance radiation with a wavelength in the range between 10 nm and 20 μm into the interior volume through the access port and reduces a propagation of the electromagnetic disturbance radiation in the interior volume.

11 Claims, 16 Drawing Sheets

(51) Int. Cl.
  *B81B 3/00* (2006.01)
  *B81B 7/02* (2006.01)
  *H04R 19/04* (2006.01)
  *H04R 1/02* (2006.01)
  *G01L 9/00* (2006.01)
  *H04R 19/00* (2006.01)

(52) U.S. Cl.
  CPC ..... *B81B 2207/091* (2013.01); *B81B 2207/11* (2013.01); *H04R 19/005* (2013.01); *H04R 2201/003* (2013.01)

(56) References Cited

U.S. PATENT DOCUMENTS

| | | | | |
|---|---|---|---|---|
| 6,594,369 B1* | 7/2003 | Une | H04R 19/016 | 381/174 |
| 6,744,896 B2* | 6/2004 | Tanabe | H04R 19/00 | 381/174 |
| 6,898,292 B2* | 5/2005 | Tanabe | H04R 19/016 | 381/174 |
| 7,166,910 B2* | 1/2007 | Minervini | B81B 7/0064 | 257/704 |
| 7,184,563 B2* | 2/2007 | Collins | H04R 19/016 | 381/174 |
| 7,233,674 B2* | 6/2007 | Song | H04R 19/016 | 381/113 |
| 7,242,089 B2* | 7/2007 | Minervini | B81B 7/0064 | 257/704 |
| 7,260,230 B2* | 8/2007 | Feng | H04R 19/016 | 381/174 |
| 7,269,268 B2* | 9/2007 | Song | H04R 1/06 | 381/113 |
| 7,292,696 B2* | 11/2007 | Saeki | H04R 3/007 | 181/158 |
| 7,327,851 B2* | 2/2008 | Song | H04R 19/04 | 381/174 |
| 7,381,589 B2* | 6/2008 | Minervini | H04R 1/04 | 438/113 |
| 7,434,305 B2* | 10/2008 | Minervini | H04R 19/016 | 29/594 |
| 7,439,616 B2* | 10/2008 | Minervini | H04R 19/04 | |
| 7,537,964 B2* | 5/2009 | Minervini | B81B 7/0064 | 29/594 |
| 7,697,707 B2* | 4/2010 | Akino | H04R 19/04 | 381/369 |
| 7,825,484 B2* | 11/2010 | Martin | B81C 1/00182 | 257/415 |
| 7,907,743 B2* | 3/2011 | Izuchi | H04R 19/016 | 381/174 |
| 7,974,430 B2* | 7/2011 | Izuchi | H04R 19/04 | 381/369 |
| 8,018,049 B2* | 9/2011 | Minervini | B81C 1/00158 | 257/704 |
| 8,112,130 B2* | 2/2012 | Mittleman | H04M 1/035 | 455/575.1 |
| 8,121,331 B2* | 2/2012 | Minervini | B81B 7/0064 | 381/360 |
| 8,155,355 B2* | 4/2012 | Ogura | B81B 7/0061 | 381/174 |
| 8,169,041 B2* | 5/2012 | Pahl | B81B 7/0064 | 257/416 |
| 8,194,907 B2* | 6/2012 | Kopnov | H04R 1/086 | 381/355 |
| 8,229,139 B2* | 7/2012 | Pahl | B81B 7/0064 | 381/122 |
| 8,391,531 B2* | 3/2013 | Harano | H04R 1/1041 | 381/369 |
| 8,447,057 B2* | 5/2013 | Goida | H04R 1/02 | 381/361 |
| 8,472,648 B2* | 6/2013 | Wang | H04R 19/005 | 381/175 |
| 8,476,809 B2* | 7/2013 | Chen | H02N 1/006 | 310/344 |
| 8,488,817 B2* | 7/2013 | Mittleman | H04R 1/025 | 381/189 |
| 8,571,249 B2* | 10/2013 | Wang | H04R 31/00 | 381/355 |
| 8,724,841 B2* | 5/2014 | Bright | H04R 1/086 | 381/359 |
| 8,767,982 B2* | 7/2014 | Harney | H04R 19/04 | 381/174 |
| 8,823,116 B2* | 9/2014 | Weber | B81B 3/0018 | 257/416 |
| 9,024,396 B2* | 5/2015 | Dehe | B81B 3/0094 | 257/416 |
| 9,078,063 B2* | 7/2015 | Loeppert | H04R 1/04 | |
| 9,120,668 B2* | 9/2015 | Park | B81B 7/0077 | |
| 9,234,518 B2* | 1/2016 | Locke | F04B 43/046 | |
| 9,345,159 B2* | 5/2016 | Peng | H05K 5/068 | |
| 9,363,589 B2* | 6/2016 | Lippert | H04R 1/023 | |
| 9,380,377 B2* | 6/2016 | Jingming | H04R 1/02 | |
| 9,432,759 B2* | 8/2016 | Elian | B81B 7/0061 | |
| 9,479,854 B2* | 10/2016 | Loeppert | H04R 1/08 | |
| 9,497,529 B2* | 11/2016 | Jeziorek | H04R 1/086 | |
| 9,628,919 B2* | 4/2017 | Conti | H01L 29/84 | |
| 9,681,210 B1* | 6/2017 | Lippert | H04R 1/023 | |
| 9,758,372 B1* | 9/2017 | Kuo | B81C 1/00333 | |
| 9,794,661 B2* | 10/2017 | Watson | H04R 17/00 | |
| 9,811,121 B2* | 11/2017 | Cardinali | H04R 7/00 | |
| 9,828,240 B2* | 11/2017 | Liu | B81C 1/00238 | |
| 9,860,623 B1* | 1/2018 | Lee | H04R 1/04 | |
| 9,883,270 B2* | 1/2018 | Lim | H04R 1/086 | |
| 9,992,563 B2* | 6/2018 | Zhang | H04R 1/086 | |
| 10,132,706 B2* | 11/2018 | Perkins | G01L 19/0672 | |
| 10,291,973 B2* | 5/2019 | Lim | H01L 24/00 | |
| 10,405,106 B2* | 9/2019 | Lee | H04R 19/005 | |
| 10,466,047 B2* | 11/2019 | Ehman | G01L 9/0041 | |
| 10,562,761 B2* | 2/2020 | Sooriakumar | H04R 19/04 | |
| 10,587,942 B1* | 3/2020 | Minervini | B81B 3/0021 | |
| 10,591,326 B2* | 3/2020 | Lim | B81B 7/02 | |
| 10,595,107 B2* | 3/2020 | Vitt | H04R 1/023 | |
| 10,631,073 B2* | 4/2020 | Schipper | H04R 1/086 | |
| 2002/0102004 A1* | 8/2002 | Minervini | B81B 7/0064 | 381/175 |
| 2007/0013052 A1 | 1/2007 | Zhe et al. | | |
| 2011/0293128 A1* | 12/2011 | Kuratani | B81C 1/0023 | 381/361 |
| 2012/0177239 A1* | 7/2012 | Lee | H04R 1/086 | 381/359 |
| 2013/0161702 A1* | 6/2013 | Chen | B81C 1/00246 | 257/254 |
| 2014/0064546 A1 | 3/2014 | Szczech et al. | | |
| 2014/0093095 A1* | 4/2014 | Slotte | H04R 1/02 | 381/87 |
| 2016/0353212 A1 | 12/2016 | Lautenschlager et al. | | |
| 2017/0121173 A1* | 5/2017 | Hoekstra | H04R 1/04 | |

FOREIGN PATENT DOCUMENTS

| | | |
|---|---|---|
| DE | 102009019446 A1 | 11/2010 |
| DE | 102014019746 B3 | 12/2016 |
| EP | 3026406 A1 | 6/2016 |

\* cited by examiner

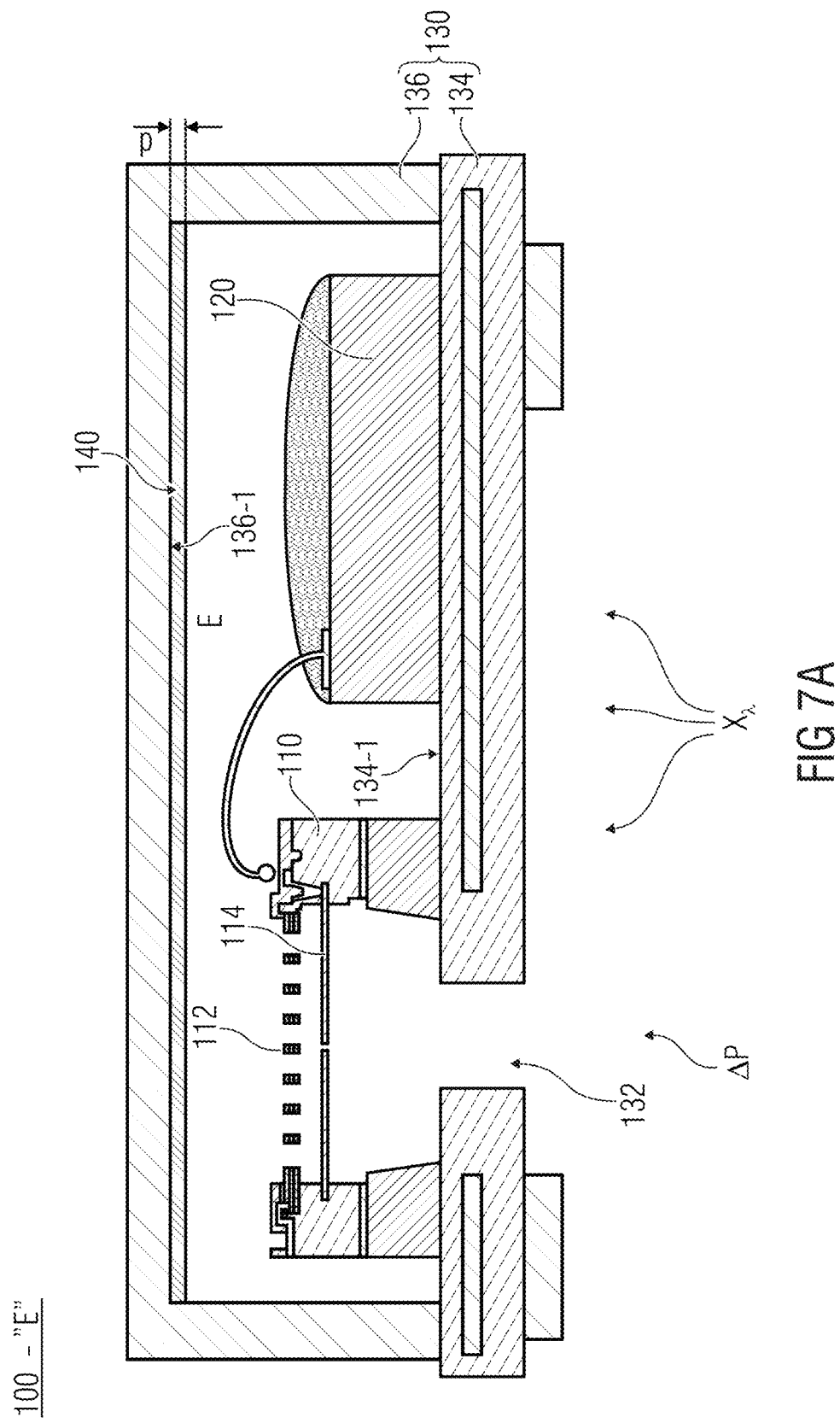

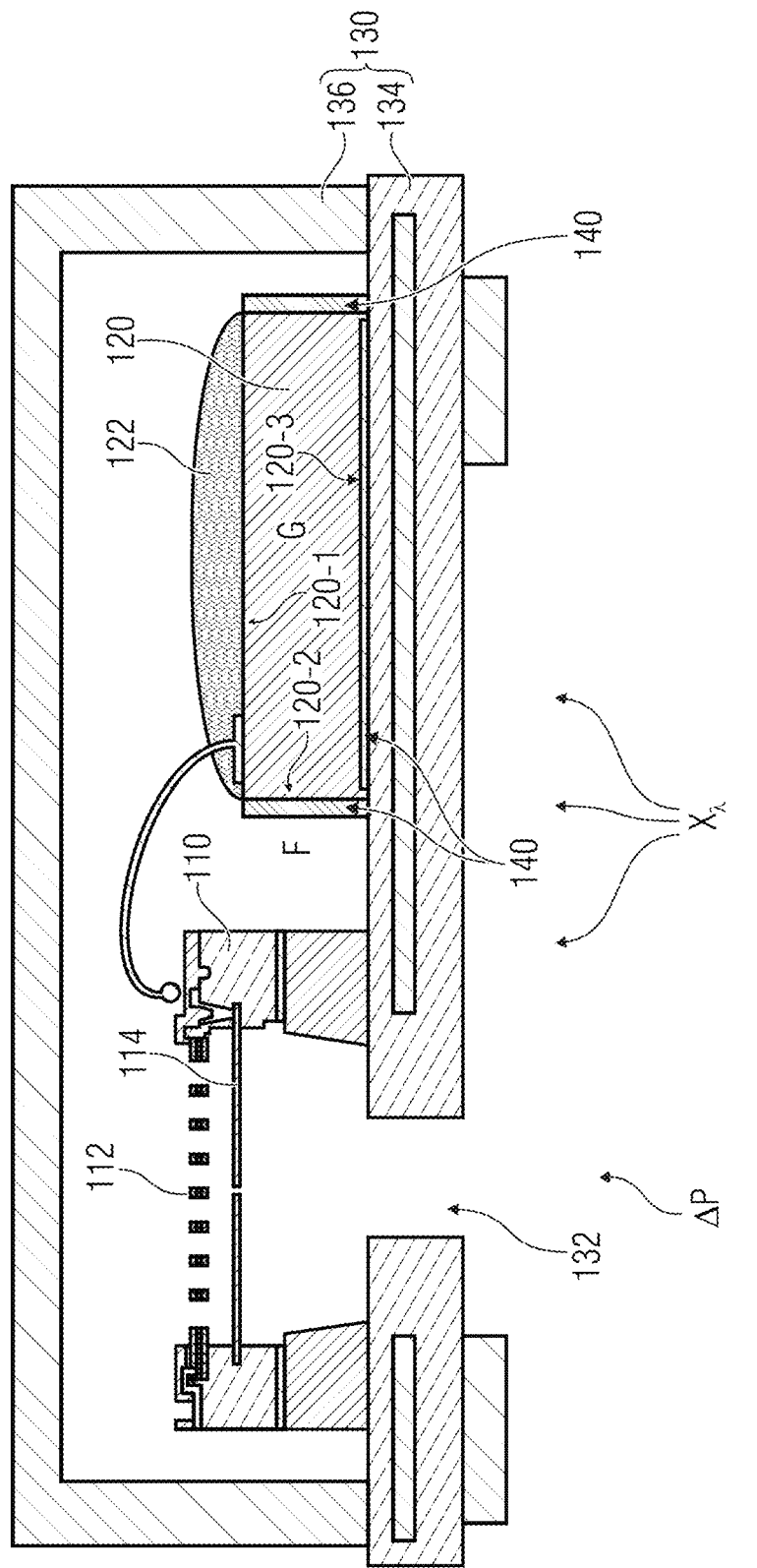

MEMS-SENSOR

This application claims the benefit of German Application No. 102018203098.7, filed on Mar. 1, 2018, which application is hereby incorporated herein by reference.

TECHNICAL FIELD

Exemplary embodiments relate to a MEMS sensor or MEMS assembly. In particular, exemplary embodiments relate to a protection structure for a MEMS sensor for at least reducing the influence of electromagnetic disturbance radiation with a wavelength in the range between 10 nm and 20 μm, for example, on a MEMS component arranged in the housing and/or an integrated circuit arrangement arranged in the housing.

BACKGROUND

Acoustic MEMS sensors, such as MEMS microphones or pressure sensors, for example, are open components and exposed to the ambient surroundings due to the functioning thereof in order, for example, to be able to capture sound level changes, pressure changes, etc., in the surroundings. Hence, such MEMS sensors are often exposed to the external ambient electromagnetic radiation, too. In general, MEMS sensors comprise a MEMS component such as a MEMS microphone, for example, arranged on a substrate, said MEMS component being surrounded by a housing. The housing should protect the MEMS component from the ambient conditions. Often, the substrate or the printed circuit board (PCB) and the cover (lid) usually already have a protection by metallization or a metal layer. By way of example, external electromagnetic radiation, such as, for example, natural sunlight, artificial light, e.g., from halogen spots, etc., infrared radiation, e.g., from IR remote controls, etc., can penetrate into the housing through the sound port, with a disturbance in the output signal of the MEMS component possibly being caused by the introduced constant, or else pulsed, radiation.

Thus, in summary, it is possible to note that acoustic sensors, such as MEMS sound transducers or MEMS microphones, for example, are susceptible to electromagnetic radiation that can penetrate into the sensor, in particular through the sound port. On account of electrical disturbances or interferences, this electromagnetic disturbance radiation can lead to reduced capability of the acoustic sensor. During practical operation, signal artifacts may occur within the "audible" bandwidth (audio bandwidth) of the sensor output signal.

SUMMARY

Since there is a constant need for MEMS sensor components such as, for example, MEMS sound transducers, MEMS microphones or MEMS pressure sensors, etc., which capture the desired measurement results such as, for example, acoustic signals or pressure changes with a sufficiently high accuracy in the field of the sensors, there is a need for the influence of electromagnetic disturbance radiation on the MEMS sensor or the MEMS component to be reduced.

Such a need can be satisfied by the subject matter of the present independent patent claims. Developments of the present concept are defined in the dependent claims.

A MEMS sensor comprises a housing with an interior volume, wherein the housing has an access port to the interior volume, a MEMS component in the housing, and a protection structure, which is embodied to at least reduce an introduction of electromagnetic disturbance radiation $X\lambda$ with a wavelength in the range $\Delta\lambda$ between 10 nm and 20 μm into the interior volume through the access port and/or at least reduce a propagation of the electromagnetic disturbance radiation $X\lambda$ in the interior volume.

According to exemplary embodiments, the MEMS sensor, which, for example, is embodied as an acoustic sound transducer or pressure sensor, etc., has a MEMS component adjacent to an access or sound port provided in the housing, wherein a protection structure is provided on the housing in order to at least reduce the influence of external electromagnetic disturbance radiation with a wavelength in, for example, the visible range, UV range or IR range on a MEMS component arranged in the housing and/or on an integrated circuit device arranged in the housing. Thus, a protection structure can be provided on the sound port of the housing in order to at least reduce penetration of the electromagnetic disturbance radiation into the interior volume through the sound port. According to one exemplary embodiment, the protection structure can also be arranged, alternatively or additionally, within the interior volume of the housing in order to at least reduce a propagation of the electromagnetic disturbance radiation in the interior volume.

According to exemplary embodiments, the protection structure can be effectively embodied on the sound port in such a way that the sound port is substantially transmissive to an acoustic signal and substantially opaque to the electromagnetic disturbance radiation.

By way of example, the protection structure, as a protection layer against electromagnetic disturbance radiation, can be arranged spatially close to the sound port of the housing of the sound transducer, wherein this protection layer has small acoustic openings or perforation openings, for example, in order firstly to allow the sound to substantially penetrate into the interior volume of the housing of the MEMS sensor, i.e., allow at least 50%, 80% or 99% of said sound to penetrate, but, secondly, to be substantially opaque to the electromagnetic disturbance radiation, i.e., stop at least 50%, 80% to 99% of said electromagnetic disturbance radiation. A protection structure that is opaque to the electromagnetic disturbance radiation can have a reflecting or absorbing embodiment in the predetermined wavelength range. A protection structure or layer structure that reflects at least 50%, 80% or 99% of the incident disturbance radiation is considered to be reflective.

According to one exemplary embodiment, the protection structure can be further arranged within the interior volume of the housing in order to absorb to the best possible extent the (residual) electromagnetic disturbance radiation that has penetrated into the interior volume. The protection structure or layer structure that actually absorbs at least 50%, 80% or 99% of the incident electromagnetic disturbance radiation can be assumed to be absorbent.

Further, the protection layer can be arranged at predetermined regions within the interior volume of the housing in such a way as to protect the MEMS component arranged in the interior volume, or else electric or integrated circuit elements arranged therein, from the electromagnetic disturbance radiation by virtue of the protection structure being arranged on the elements and being embodied to be reflective or absorbent for the electromagnetic disturbance radiation in the wavelength range.

By way of example, opaque glop-top materials can be used on the component plane in order to protect sensitive ASIC structures, wherein, depending on the specific geometries and the light source, all sensitive regions on the ASIC are covered by the protection structure in the form of glop-top material (disturbance-radiation-opaque silicone). Moreover, the protection structure can effectively prevent the MEMS component, i.e., the MEMS chip or MEMS die, from taking up electromagnetic radiation directly via the thermoelectric effect or else indirectly via the thermomechanical or thermoacoustic effect. As a result, interferences in the audible bandwidth range of the sensor output signal can be prevented or at least reduced. By preventing disturbances in the audio bandwidth of the sensor output signal, it is possible to maintain a high signal-to-noise ratio (SNR) of the MEMS sensor.

Consequently, according to exemplary embodiments, the protection structure, for example with a layer-shaped embodiment, can be arranged as part of the outer sound port, as integrated part of the sound port, as part of the front cavity (of the front volume), as part of the MEMS component, as part of the interior region or interior volume of the housing, as part of the ASIC or the ASIC arrangement, as part of the design of the housing and/or as part of the design of a carrier board for assembling the housing.

BRIEF DESCRIPTION OF THE DRAWINGS

Exemplary embodiments of apparatuses and/or methods are described in more detail below in exemplary fashion, with reference being made to the attached figures and drawings. In the drawings:

FIGS. 7a-7b, in each case show a schematic diagram in a cross-sectional view of a MEMS sensor with a protection structure according to configuration E as per one exemplary embodiment;

FIGS. 8a-8b in each case show a schematic diagram in a cross-sectional view of a MEMS sensor with a protection structure according to configurations F and G as per one exemplary embodiment;

DETAILED DESCRIPTION OF ILLUSTRATIVE EMBODIMENTS

Before exemplary embodiments are described more closely in detail in the figures below, reference is made to the fact that identical, functionally identical or similarly acting elements, objects, functional blocks and/or method steps are provided with the same reference sign in the various figures such that the description, illustrated in the various exemplary embodiments, of these elements, objects, functional blocks and/or method steps is interchangeable among one another or can be applied to one another.

Various exemplary embodiments will now be described in more detail, with reference being made to the attached figures, which illustrate some exemplary embodiments. In the figures, the strengths of lines, layers and/or regions may, for elucidation purposes, not be illustrated true to scale.

Below, a MEMS sensor 100 with a MEMS component no and an optional, integrated circuit device 120 (ASIC=application-specific integrated circuit), which is electrically coupled to the MEMS component no, for example, is described on the basis of FIG. 1 in the form of a schematic diagram in a cross-sectional view, including an exemplary illustration of different protection structures 140 according to different configurations A-G.

By way of example, the MEMS component no can be embodied as a MEMS sound transducer. However, reference is made to the fact that the explanations below are equally applicable to all MEMS components, such as sound transducers, pressure sensors, etc., which are housed in a housing 130.

Figure 1:
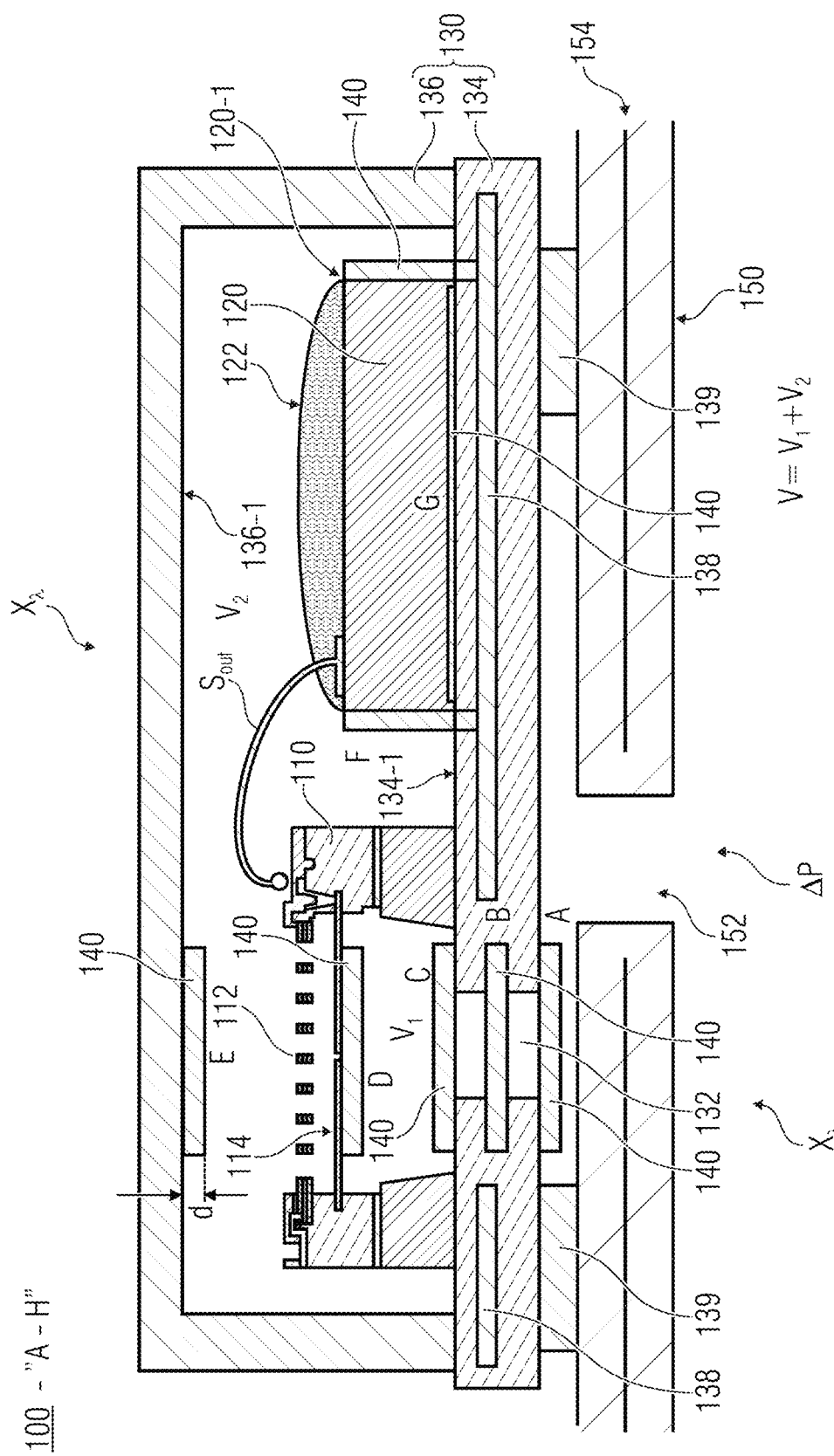
FIG. 1 shows a schematic diagram in a cross-sectional view of a MEMS sensor with an exemplary illustration of different protection structures according to configurations A-G as per exemplary embodiments.

As illustrated in FIG. 1 in exemplary fashion, the MEMS component no can be arranged in a housing 130 with an interior volume V, with the housing 130 having an access or sound port 132 to the interior volume V, for example. The MEMS component no is arranged in the housing, for example adjacent to the sound port 132. Now, the MEMS sensor 100 further has a protection structure 140, which is embodied to at least reduce penetration of electromagnetic disturbance radiation Xλ with a wavelength in a range Δλ between 10 nm and 20 µm into the interior volume V through the sound port 132 and/or to at least reduce a propagation of the electromagnetic radiation Xλ in the interior volume V.

As illustrated in FIG. 1, the protection structure 140 can have or adopt a number of different configurations A-H, which are specified together in an exemplary fashion in the schematic diagram in FIG. 1. In respect of the different configurations A-H of the protection structure 140 illustrated in FIG. 1, reference is made to the fact that the protection structure 140 according to the exemplary embodiments can be embodied individually in each case according to one of the illustrated embodiments A-H, or else in a combination of at least two (or else all) of the illustrated embodiments A-H. According to exemplary embodiments, as illustrated in FIG. 1, the protection structure 140 can be embodied as part of the external sound port according to configuration A, as an integrated part of the sound port according to configuration B, as part of the front cavity (front volume) according to configuration C, as part of the MEMS component according to configuration D, as part of the interior housing according to configuration E, as part of the circuit device (ASIC or ASIC arrangement) according to configuration F, as part of the substrate design and/or the ASIC arrangement according to configuration G and/or as part of a carrier board in combination with the housing substrate according to configuration H.

According to exemplary embodiments, the protection structure or protection layer 140 can have at least one or more of the properties set forth below. By way of example, the protection structure 140 can have an acoustically transparent embodiment that is reflective for the disturbance radiation in the desired wavelength range, for example in a range Δλ between 10 nm and 20 μm, and/or it can be embodied to be absorbent in the desired frequency range of the electromagnetic disturbance radiation. Consequently, the wavelength range Δλ of the electromagnetic disturbance radiation can comprise visible light (e.g., sunlight), UV (ultraviolet) light and/or IR (infrared) light. By way of example, typical IR light sources are IR remote controls, TOF (time-of-flight) sensors, etc. Consequently, the protection structure 140 can be embodied to selectively reflect and/or absorb a predetermined wavelength range of visible light, UV radiation or IR radiation.

By way of example, a reflecting protection structure or layer structure 140 can be embodied as a metal layer or as a so-called Bragg reflector. By way of example, reflecting metal materials in the form of a metal layer or a metal ply, e.g. a metal ply applied by sputtering, applied on a base material can be considered as reflecting materials. The thickness of such applied metal plies can lie in the region of several atomic layers, i.e., for example, of the order of 0.1 nm or between 0.5 nm and 10 nm. Further, use can be made of so-called "Bragg filter structures" or Bragg mirrors with a relatively high wavelength selectivity. By way of example, Bragg mirrors consist of alternating, dielectric thin layers with a low and high refractive index.

By way of example, an absorbing layer structure or protection structure 140 can have a disturbance-radiation-opaque or absorbing plastic or silicone material (e.g., dark or black glop-top material).

Terms for layers or layer structures used within the scope of the present description comprise both individual layers and multi-ply layers (layer stacks), which together form a resultant layer structure, for example.

The description of the light-opaque protection structures 140, i.e., the protection structures 140 reflecting or absorbing electromagnetic disturbance radiation in the wavelength range Δλ, is equally applicable to all exemplary embodiments.

In respect to the specific configuration of the protection structure 140 according to configurations A-H, reference is made in detail to the following description, with reference being made to FIGS. 2 to 9a-9b.

Below, general, exemplary configurations of the MEMS sensor 100 are discussed further, said exemplary configurations being equally applicable to the exemplary embodiments according to configurations A-H of the protection structure 140 in subsequent FIGS. 2 to 9a-9b and the associated description.

Now, for example, the housing 130 of the MEMS sensor 100 can have a substrate 134 and a covering element 136, which can, at least in regions, have an electrically conductive embodiment. Now, for example, the carrier substrate 134 can have a conductive layer structure (e.g., wiring plane) 138, which may be electrically connected to the electrically conductively embodied portion of the covering element 136, for example. Further, the carrier substrate 134 can have contact connector areas (solder pads) 139 in order to mechanically and/or electrically connect the housing 130 to an optional carrier board 150 which, for example, can have a sound port 152 in turn. Now, for example, the carrier board 150 can have a conductive layer structure (e.g., wiring plane) 154. The carrier board 150 for the MEMS sensor 100 or the MEMS sensor module can be embodied as a flex board or main board.

In an exemplary arrangement as a MEMS sound transducer, the MEMS component 110 can subdivide the volume V into a front volume $V_1$ and a back volume $V_2$, with the front volume $V_1$ being situated in the region between the sound port 132 and the MEMS sound transducer 110 and the back volume $V_2$ being situated in the interior volume V of the housing 130 on the side of the MEMS sound transducer 110 lying opposite thereto.

Thus, according to one exemplary embodiment, the MEMS component 100 comprises a MEMS sound transducer no with a membrane structure 114 and an associated counter electrode structure 112, and further an integrated circuit device 120, which is electrically coupled to the MEMS sound transducer 110. On an upper surface region 120-1, the circuit device 120 can have a radiation-absorbing layer 122 with a light-opaque silicone glop-top material, for example. Thus, silicone material (glop-top material) that is opaque to the wavelength of the electromagnetic disturbance radiation can be arranged on the upper surface region 120-1 of the electric circuit device 120, for example. The circuit device 120 can be further embodied to capture and output an audio output signal $S_{out}$ of the MEMS sound transducer 110 on the basis of a deflection of the membrane structure 114 in relation to the counter electrode structure 112, brought about by the acoustic sound pressure change ΔP.

According to exemplary embodiments, the covering element 136 further can be embodied in electrically conductive fashion and can be electrically coupled or connected to the conductive structure 138 of the substrate 134 in order to be able to electrically connect the covering element 136 to a reference potential, e.g., ground potential, for example.

Thus, the MEMS component no can be embodied as a MEMS sound transducer or MEMS microphone with the membrane structure 114 and the assigned counter electrode structure 112, and can be electrically coupled to the integrated circuit device 120 (ASIC) in order to provide a corresponding audio output signal $S_{out}$ on the basis of an incident acoustic sound pressure change ΔP and the deflection between the membrane structure 114 and the counter electrode structure 112 resulting therefrom.

According to one exemplary embodiment, the MEMS component 110, which is embodied as a MEMS microphone, for example, can have a further counter electrode structure (not shown in FIG. 1) and consequently can be embodied as a dual backplate configuration, i.e., in a configuration with two counter electrode structures and the membrane structure lying therebetween.

According to a further exemplary embodiment, the MEMS component no, which is embodied as a MEMS microphone, can have a further membrane structure (not shown in FIG. 1), which is mechanically connected to the first membrane structure, for example by mechanical connection elements (not shown in FIG. 1), in order to form a so-called dual membrane configuration, i.e., a configuration with two membrane structures and a counter electrode structure lying therebetween.

Figure 2:
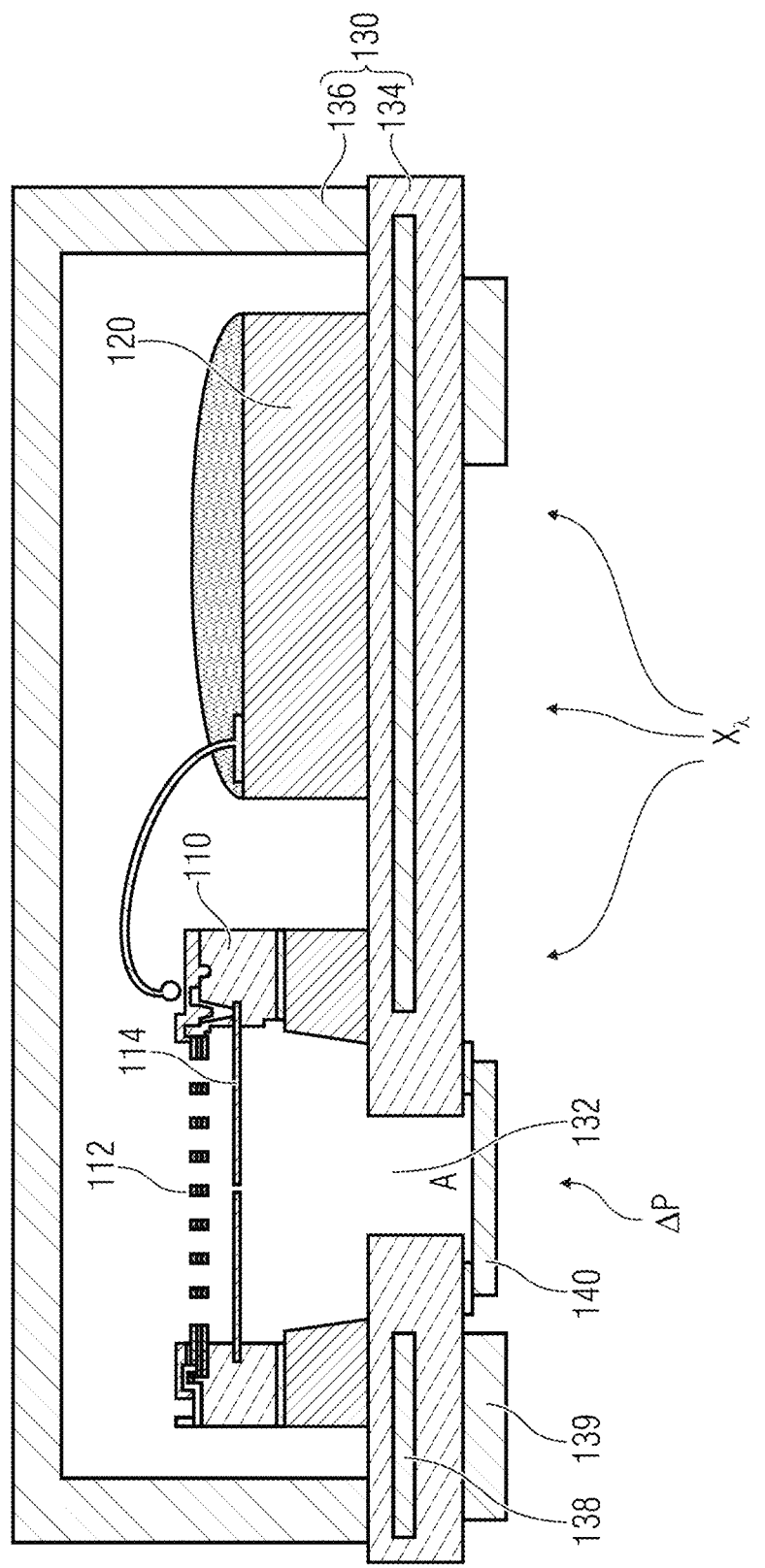
FIG. 2 shows a schematic diagram in a cross-sectional view of a MEMS sensor with a protection structure according to configuration A as per one exemplary embodiment.

A MEMS sensor boo with the MEMS component no housed in the housing 130 is now described below on the basis of FIG. 2, in the form of a schematic diagram in a cross-sectional view, wherein the protection structure 140 according to configuration A is embodied on the sound port 132 of the substrate 134 in such a way that the sound port 132 is transmissive to an acoustic signal ΔP (within a tolerance range) and opaque to the electromagnetic disturbance radiation Xλ (within a tolerance range). The protection structure 140 can have a reflecting or absorbing embodiment for the electromagnetic disturbance radiation Xλ in the wavelength range Δλ. The protection structure 140 that is reflective for the electromagnetic disturbance radiation Xλ in the wavelength range can be embodied as a reflecting layer element with a metal layer or a Bragg reflector. Consequently, the protection structure 140 can be arranged on the outer side of the housing 130 as a plate-shaped or layer-shaped protection element and can at least partly, or else completely, cover the sound port 132.

If the protection structure 140 with a layer-shaped embodiment according to configuration A has a conductive embodiment, the protection structure 140 can be further electrically coupled or connected to the conductive structure 138 of the substrate 134 in order also to be able to electrically connect the conductive protection structure 140 to the reference potential, e.g., ground potential.

Now, a further exemplary embodiment of the protection structure 140 according to configuration A is described in exemplary fashion below on the basis of FIG. 3, which is in the form of a schematic diagram in a cross-sectional view of the MEMS sensor 100.

Figure 3:
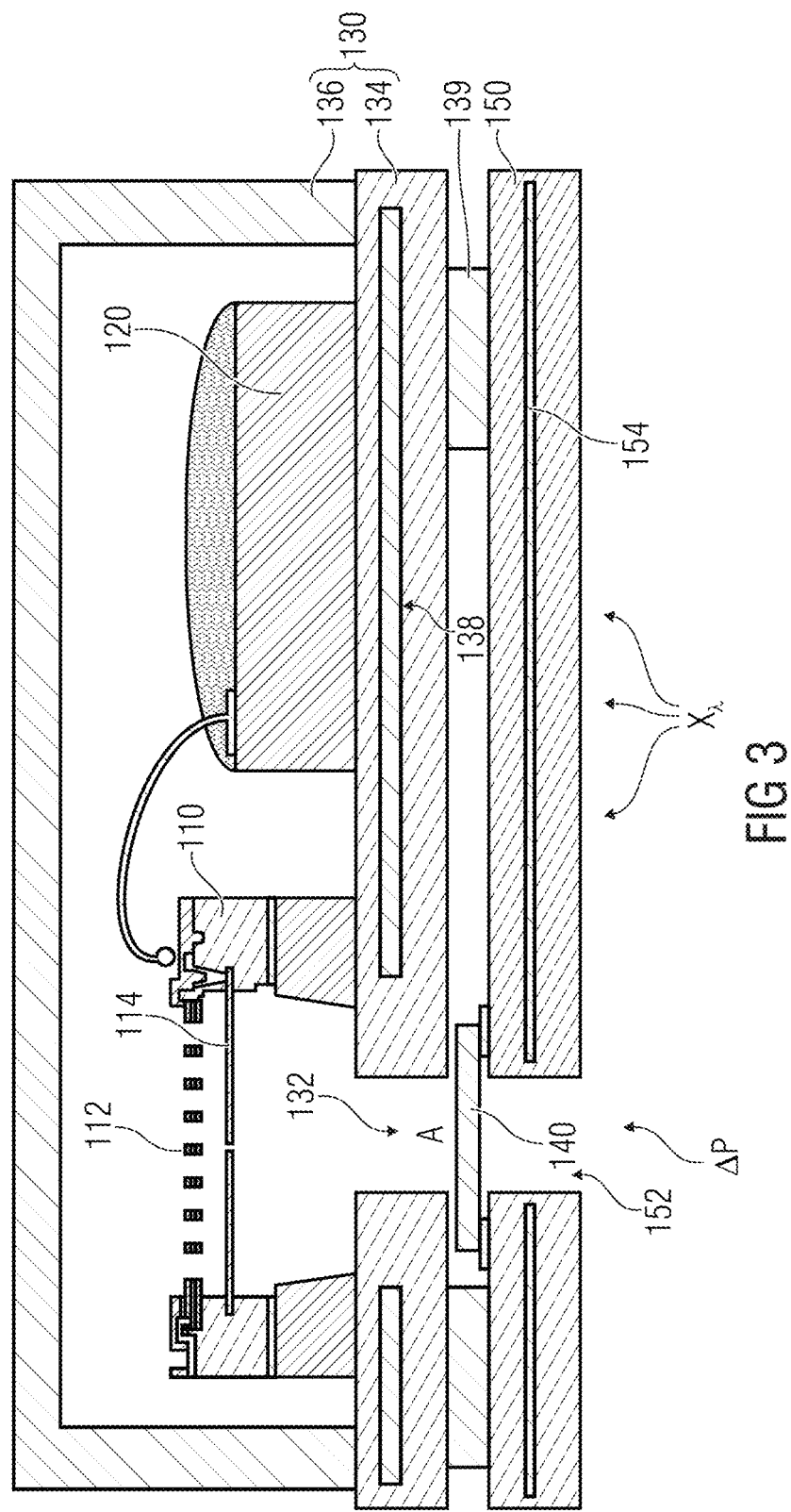
FIG. 3 shows a schematic diagram in a cross-sectional view of a MEMS sensor with a protection structure according to configuration A as per one exemplary embodiment.

As illustrated in FIG. 3, the housing 130 or the carrier substrate 134 of the housing 130 is arranged on the carrier board 150, i.e., electrically and/or mechanically connected to same, wherein the carrier board 150 has the carrier board sound port 152. The protection structure 140, embodied in layer-shaped fashion in an exemplary manner, is arranged between the sound port 132 of the housing 130 and the carrier board sound port 152 of the carrier board 150.

According to one exemplary embodiment, the electrically conductive protection structure 140 can also be electrically coupled or connected to an electrically conductive structure or metallization plane 154 of the carrier board 150 in order to be able to electrically connect the conductive protection structure 140, for example with a layer-shaped embodiment, according to configuration A to the reference potential, e.g., ground potential.

Now, an exemplary embodiment of the protection structure 140 according to configuration B is described in exemplary fashion below on the basis of FIG. 4, which is in the form of a schematic diagram in a cross-sectional view of the MEMS sensor 100.

Figure 4:
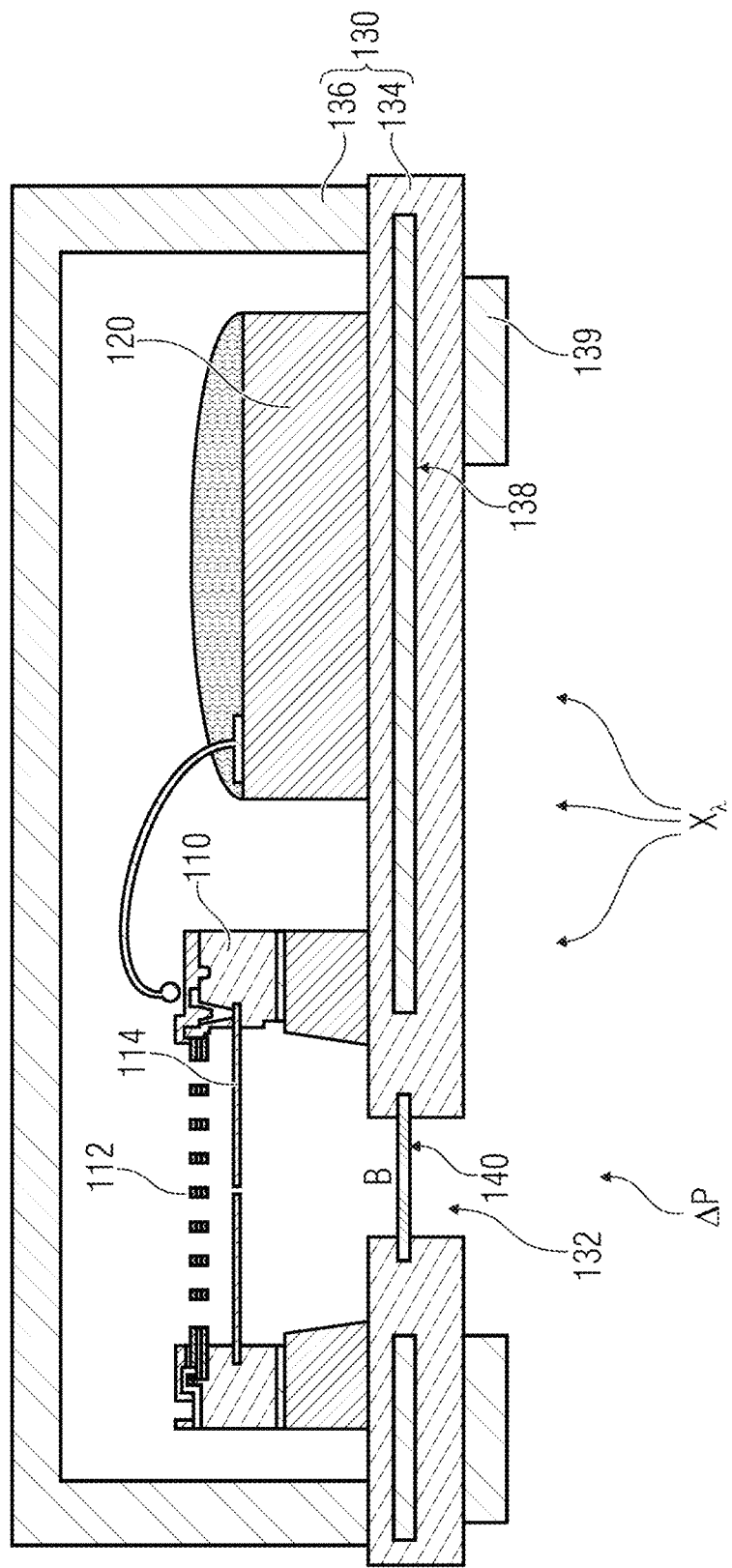
FIG. 4 shows a schematic diagram in a cross-sectional view of a MEMS sensor with a protection structure according to configuration B as per one exemplary embodiment.

As illustrated in FIG. 4, the protection structure 140 can be embedded in the housing 130 or in the substrate 134 of the housing 130 within the sound port 132 and can be embodied to be transmissive to the acoustic sound signal ΔP (within the tolerance range) and opaque to the electromagnetic disturbance radiation Xλ in the wavelength range Δλ (within the tolerance range). The protection structure 140 can have a reflecting or absorbing embodiment in relation to the electromagnetic disturbance radiation Xλ in the wavelength range Δλ. The protection structure 140 that is reflective for the electromagnetic disturbance radiation Xλ in the wavelength range can be embodied as a reflecting layer element with a metal layer or a Bragg reflector. Consequently, the protection structure 140 can be arranged on the outer side of the housing 130 as a plate-shaped or layer-shaped protection element and can at least partly, or else completely, cover the sound port 132.

If the protection structure 140 with a layer-shaped embodiment according to configuration B has a conductive embodiment, the protection structure 140 can be further electrically coupled or connected to the conductive structure 138 of the substrate 134 in order also to be able to electrically connect the conductive protection structure 140 to the reference potential, e.g., ground potential.

Now, a MEMS sensor 100 with a further exemplary embodiment of the protection structure 140 according to configuration "C" is described in exemplary fashion below on the basis of FIGS. 5a-5b in the form of a schematic diagram in a cross-sectional view.

Figure 5A:
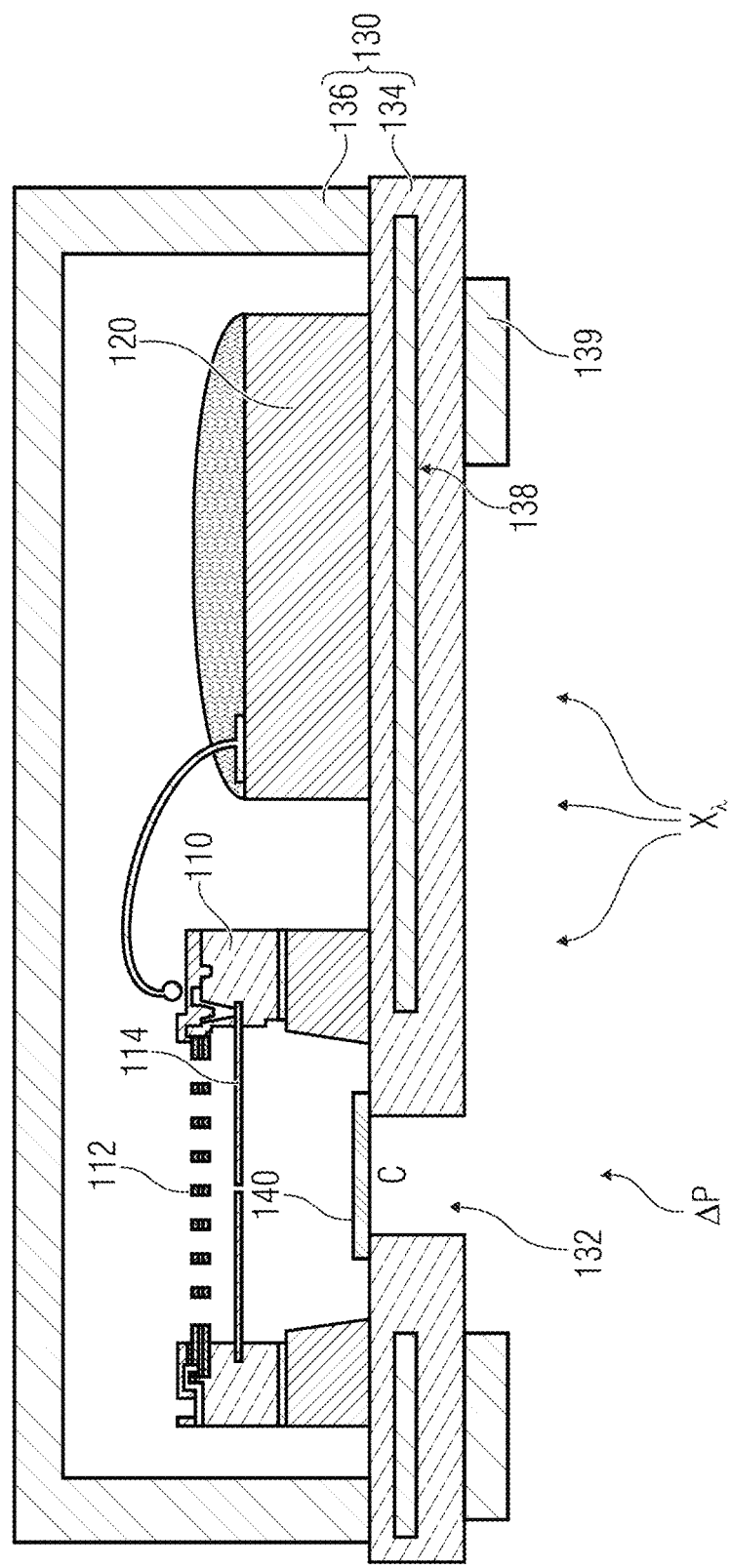
FIGS. 5a-5b in each case show a schematic diagram in a cross-sectional view of a MEMS sensor with a protection structure according to configuration C as per one exemplary embodiment.
Figure 5B:
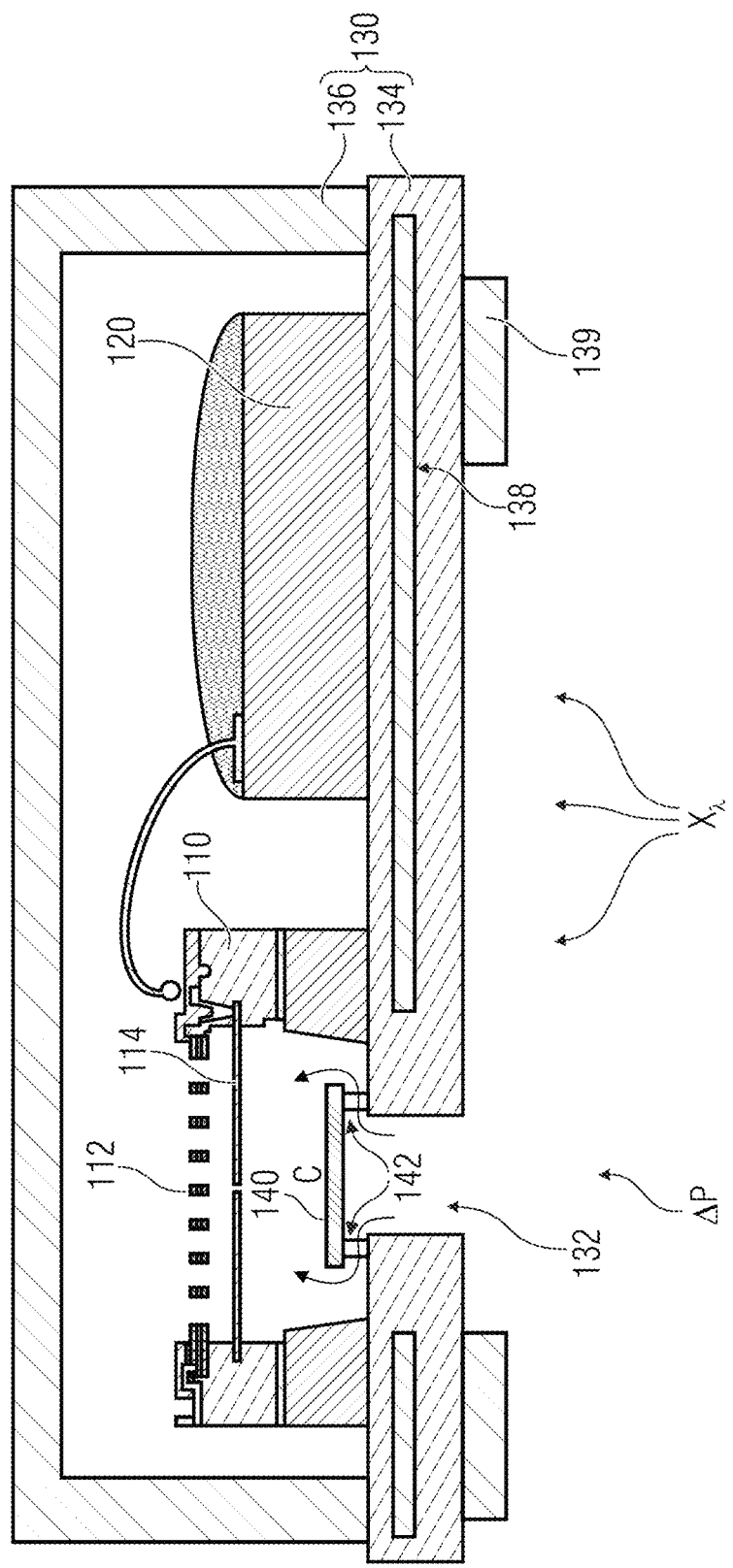

As illustrated in FIGS. 5a-5b, the protection structure 140 according to configuration "C" with a layer-shaped embodiment, for example, is arranged at the sound port 132 on the inner side of the housing 130 facing the interior volume $V_1$, wherein the sound port 132 can be at least partly, or else completely, covered by the protection structure 140. In the configuration of the protection structure 140 illustrated in FIG. 5a, a protection layer structure is arranged on the carrier substrate 134 within the interior volume V or the front volume $V_1$.

The protection structure 140 at the sound port 132 of the housing 130 is embodied to be transmissive to the acoustic sound signal ΔP (within the tolerance range) and opaque to the electromagnetic disturbance radiation Xλ in the wavelength range Δλ (within the tolerance range). The protection structure 140 can have a reflecting or absorbing embodiment for the electromagnetic disturbance radiation Xλ in the wavelength range Δλ. The protection structure 140 that is reflective for the electromagnetic disturbance radiation Xλ in the wavelength range can be embodied as a reflecting layer element with a metal layer or a Bragg reflector. Consequently, the protection structure 140 can be arranged on the outer side of the housing 130 as a plate-shaped or layer-shaped protection element and can at least partly, or else completely, cover the sound port 132. If the protection structure 140 with a layer-shaped embodiment according to configuration C has a conductive embodiment, the protection structure 140 can be further electrically coupled or connected to the conductive structure 138 of the substrate 134 in order also to be able to electrically connect the conductive protection structure 140 to the reference potential, e.g., ground potential.

In configuration "C" of the protection structure 140 illustrated in FIG. 5b, the protection structure 140 can have a layer or layer structure that is opaque to the electromagnetic disturbance radiation Xλ, said layer or layer structure being arranged on the inner side of the housing 130, i.e., arranged on the carrier substrate 134 within the interior volume V or the front volume $V_1$, by a spacer element 142. Thus, the configuration of the protection layer 140 illustrated in FIG. 5b can once again have an acoustically transparent embodiment and an embodiment that reflects the electromagnetic disturbance radiation Xλ in the wavelength range Δλ, e.g., as a metal layer and/or Bragg reflector, and/or absorbs said electromagnetic disturbance radiation, for example having a dark or black silicone material, like the layer-shaped protection structure 140 illustrated in FIG. 5a.

According to a further exemplary embodiment, the protection structure 140 with the layer-shaped embodiment according to configuration "C" in FIG. 5b need not necessarily be acoustically transparent as lateral acoustic openings can be realized through the spacer element or the spacer elements 142 (on the sidewall range of same) in order to obtain the acoustic transmissivity. Consequently, the protection structure 140 can yield a separation of the acoustic path into the interior volume V of the housing 130 from the "blocked" radiation path.

Now, a further exemplary embodiment of the protection structure 140 according to configuration "D" is described in exemplary fashion below on the basis of FIG. 6, which is in the form of a schematic diagram in a cross-sectional view of a MEMS sensor 100.

Figure 6:
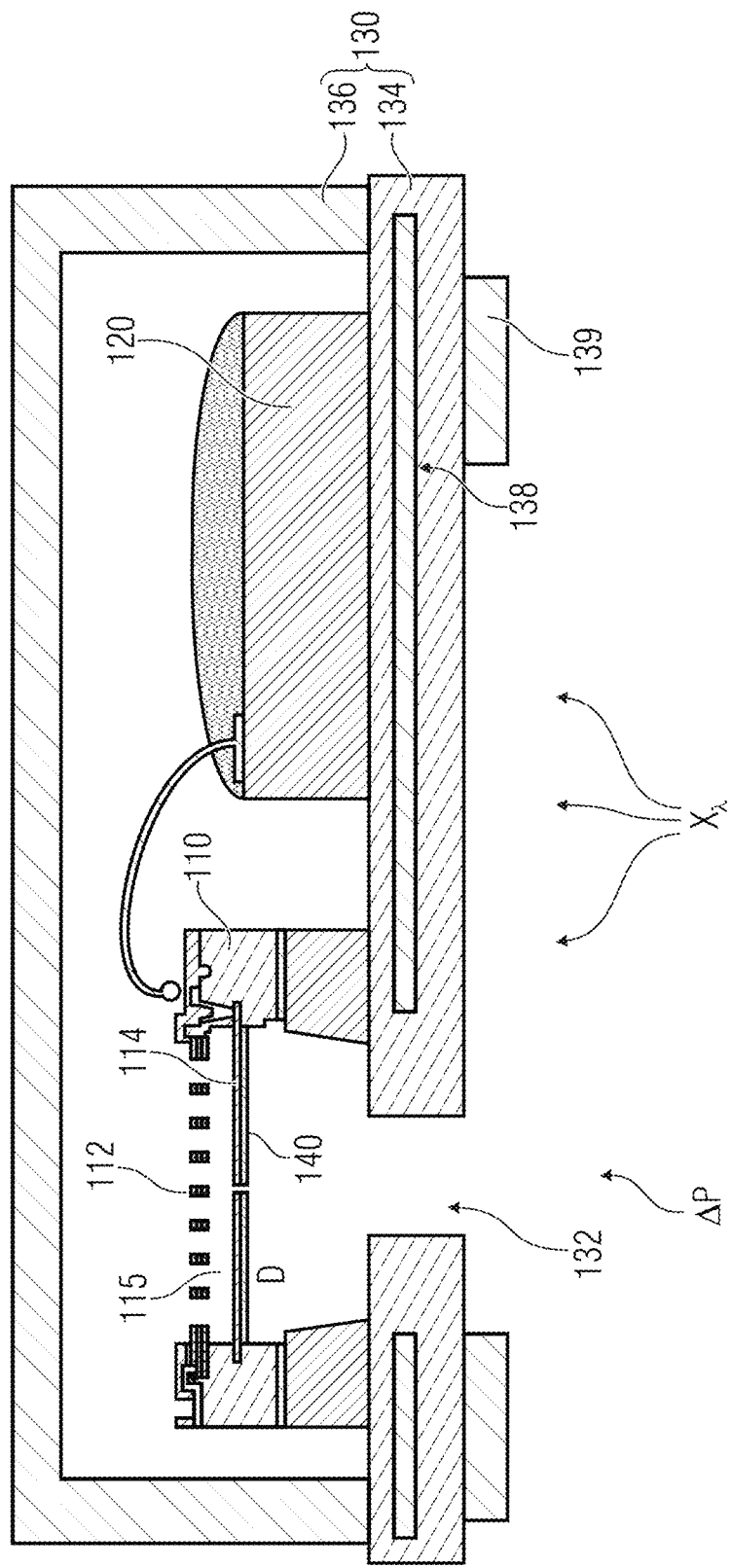
FIG. 6 shows a schematic diagram in a cross-sectional view of a MEMS sensor with a protection structure according to configuration D as per one exemplary embodiment.

In the component or MEMS sound transducer no of the MEMS sensor 100 illustrated in FIG. 6, reference is made to the fact that the counter electrode structure 114 is arranged adjacent to the front volume $V_1$ or adjacent to the sound port 132. Alternatively, the arrangement of the membrane structure 114 and the counter electrode structure 112 can also be interchanged such that the counter electrode structure 112 is also arranged adjacent to the front volume $V_1$ or the sound port 132. Consequently, the counter electrode structure 112 or membrane structure 114 facing the sound port 132 can be referred to as a microphone layer structure 112, 114 in general. Consequently, the protection structure 140 is arranged at a surface of the microphone layer structure 112, 114 of the MEMS component no facing the sound port 132 and embodied to be opaque, at least in regions, to the electromagnetic disturbance radiation Xλ in the wavelength range Δλ and, however, embodied to be transparent to the acoustic signal ΔP. Thus, the surface of the microphone layer structure 112, 114 of the MEMS component no facing the sound port 132 can be provided, at least in regions, with a reflecting layer element as a protection structure 140 for reflecting disturbance radiation or with a material that absorbs the electromagnetic disturbance radiation as a layer structure 140.

According to configuration "D" of the protection structure 140, the protection structure 140 itself is part of the MEMS component loft According to one exemplary embodiment, the microphone layer structure in the form of the counter electrode structure 112 and/or the membrane structure 114 can be coated with a metal layer that is reflective for the electromagnetic disturbance radiation in the wavelength range Δλ. The metal layer or metal ply can be applied to the microphone layer structure 112, 114, for example by sputtering. According to a further exemplary embodiment, the arrangement with the membrane structure 114 and/or the counter electrode structure 112 can be embodied as a Bragg reflector in each case or can be embodied, for example, as a Bragg resonator together with the interposed air gap 115. The explanations made above are equally applicable if use is made of a so-called "double membrane configuration" or a double counter electrode configuration of the MEMS component no.

According to a further exemplary embodiment, the microphone layer structure 112, 114, such as the counter electrode structure 112 and/or the membrane structure 114, for example, can have a material that absorbs the radiation of the electromagnetic disturbance radiation Xλ or an additional radiation-absorbing layer.

Now, a further embodiment of the protection structure 140 according to configuration "E" is described below on the basis of FIGS. 7a-7b, which are in the form of a schematic diagram in a cross-sectional view of a MEMS sensor 100.

Figure 7B:
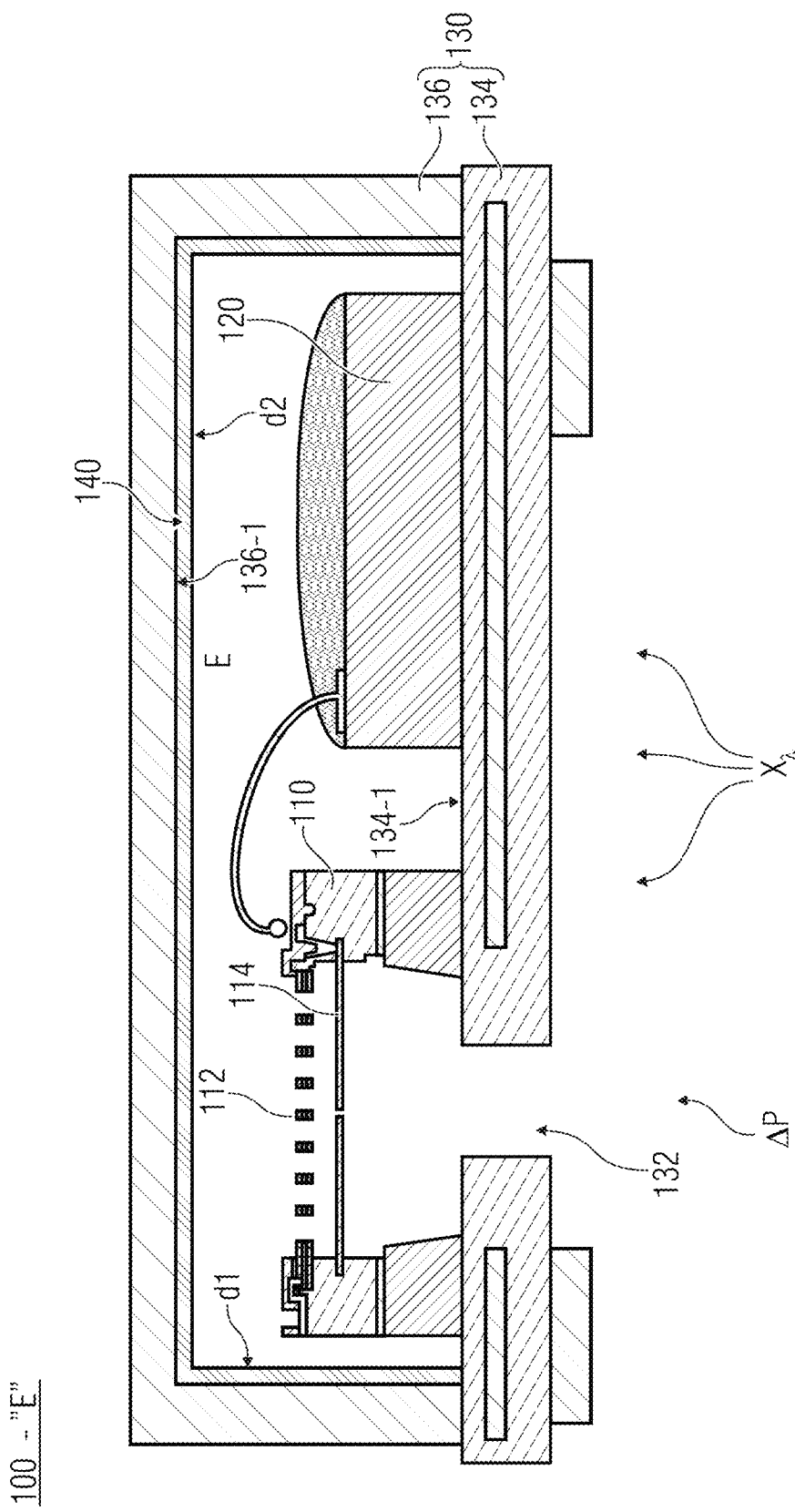

As illustrated in FIGS. 7a-7b, the protection structure 140 according to configuration "E" is arranged on a surface region 136-1 of the housing 130, facing the interior volume V, in the form of an absorbing layer or layer structure and it has an absorbing embodiment in relation to the electromagnetic disturbance radiation Xλ, for example in the wavelength range Δλ. The absorbing protection structure or layer structure 140 according to configuration "E" can consequently be arranged on the inner surface region 136-1 of the covering element 136, at least in regions.

As illustrated in FIG. 7a, the protection structure 140 is only arranged on the inner upper side of the covering element 136, while the layer structure 140 in FIG. 7b is arranged on the entire interior surface region 136-1 of the covering element 136.

According to one exemplary embodiment, the layer structure 140 with a layer-shaped embodiment can also be arranged on the interior surface region 134-1 of the carrier substrate 134, at least in regions or else completely, in addition or as an alternative to the arrangement on the surface region 136-1 (not shown in FIGS. 7a-7b).

Further, the protection structure 140 with a layer-shaped embodiment according to configuration "E" can have different layer thicknesses in different interior surface regions 136-1 of the covering element 136; i.e., proceeding from the first layer thickness d1 of approximately 10 μm, e.g., between 5 and 20 μm, in a first surface region, it can further have an increased second layer thickness d2 of approximately 20 μm, e.g., between 10 and 50 μm, with d2>d1, in a further surface region adjacent to the integrated circuit device 120, for example.

According to the exemplary embodiments of the layer structure 140 according to configuration "E", illustrated in FIGS. 7a-7b, the layer structure 140 is part of the interior housing 130. The layer structure or protection layer 140 is arranged, at least in regions, on the inner surface 134-1, 136-1 of the carrier substrate 134 and of the covering element 136 of the housing 130, respectively. According to one exemplary embodiment, the layer structure 140, embodied as an absorbing layer, can be embodied as a dark or black silicone material (glop-top material) in the relevant wavelength range Δλ of the electromagnetic disturbance radiation Xλ. According to further exemplary embodiment, the lateral dimension (area) and/or vertical dimension (thickness) of the protection structure 140 embodied in layer-shaped manner can be varied further in order to be able to adapt the protection function as effectively as possible. Thus, the protection structure 140 with the layer-shaped embodiment can be arranged on the inner surface 134-1, 136-1 of the housing 130, either in regions or completely. Further, the thickness of the protection structure 140 with a layer-shaped embodiment can have different embodiments at different interior surface regions of the housing 130 in order to effectively obtain the protective effect in relation to the electromagnetic disturbance radiation.

Now, further exemplary embodiments of the protection structure 140 according to configurations "F" and "G" are described in exemplary fashion below on the basis of FIGS. 8a-8b, which are in the form of a schematic diagram in a cross-sectional view of the MEMS sensor 100.

Figure 8B:
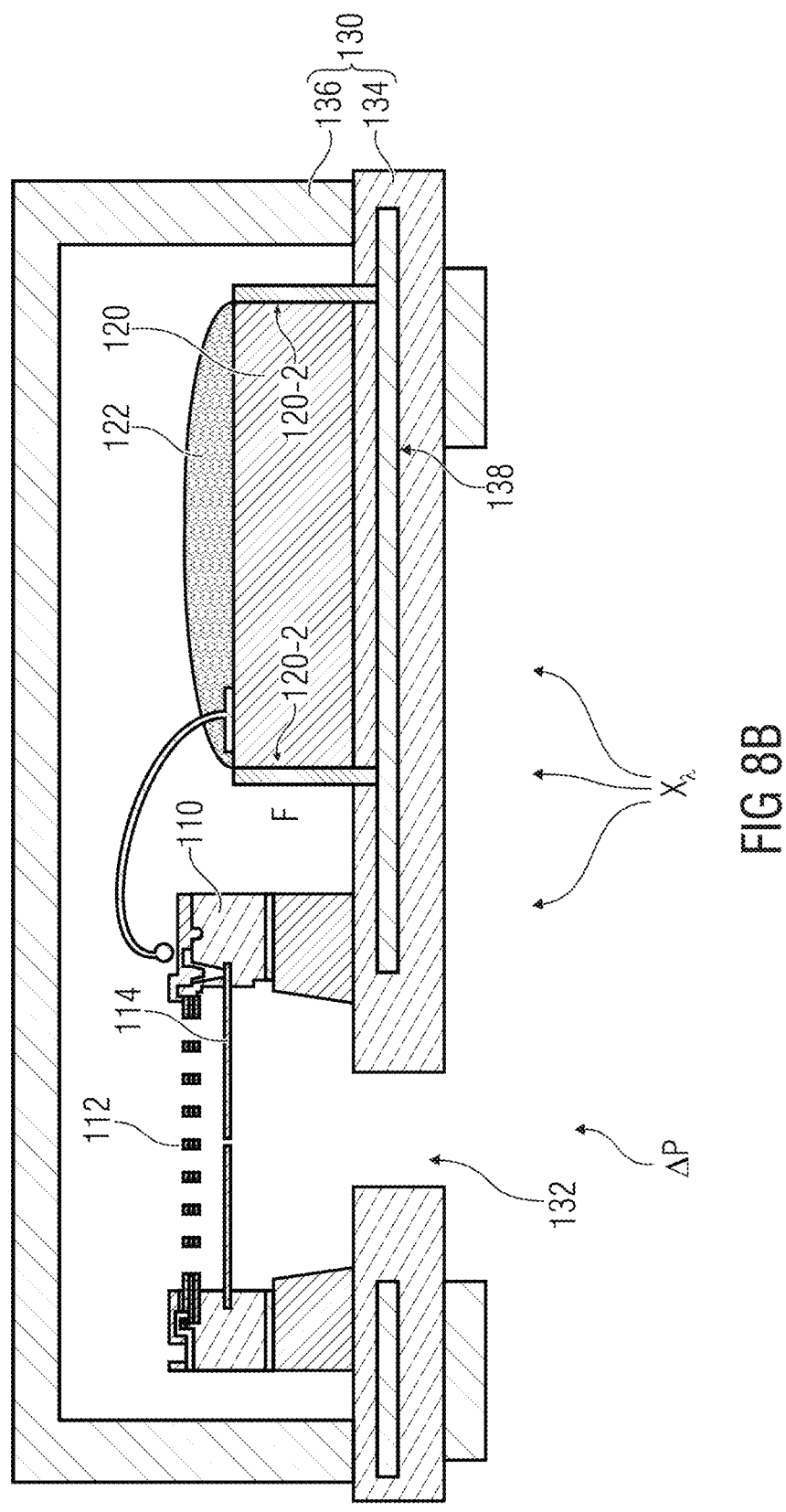

As illustrated in FIGS. 8a-8b, the MEMS sensor further has the integrated circuit 120 in the interior volume V of the housing 130, e.g., on the carrier substrate 134, wherein the protection structure 140 according to configurations F and G is arranged at least on a portion of the surface, e.g., the upper surface 120-1, the side face 120-2 or the base (adjacent to the carrier substrate 134) of the integrated circuit device 120, and embodied to be opaque to electromagnetic disturbance radiation Xλ in the predetermined wavelength range Δλ.

According to one exemplary embodiment, the protection structure 140 further can have a layer-shaped embodiment and, at the base region 120-3, the integrated circuit device 120 can be arranged neighboring or adjacent to the carrier substrate 134 of the housing 130, at least in regions.

Thus, the protection structure 140 with a layer-shaped embodiment can have a reflecting and/or absorbing embodiment for the electromagnetic disturbance radiation Xλ in the wavelength range Δλ. Thus, the protection structure 140 can at least partly, or else completely, cover the surface region 120-1, 120-2, 120-3 of the integrated circuit device 120, wherein the protection structure 140 has a layer-shaped embodiment and an embodiment that is opaque to the electromagnetic disturbance radiation Xλ. In particular, the layer structure 140 can have a layer-shaped embodiment and can be arranged on the sidewall region 120-2 of the integrated circuit device 120, as is illustrated in FIGS. 8a-8b, for example.

Further, the layer-shaped protection structure 140 on the sidewall region 120-2 of the integrated circuit device 120 can extend into the housing 130 or into the carrier substrate 134 as far as a metallization structure 138 arranged there, as is illustrated in FIG. 8b, for example. In this way, unwanted input coupling of electromagnetic disturbance radiation into the semiconductor material of the integrated circuit 120 via the material of the carrier substrate 134 can also be suppressed laterally, for example, by virtue of the metallization structure or metallization plane 138 arranged in the carrier substrate 134 additionally facilitating vertical shielding in relation to the disturbance radiation $X\lambda$, for example.

Thus, the carrier material or the solder mask of the carrier substrate 134 can be transparent to certain wavelengths of the external electromagnetic disturbance radiation, for example, while the embedded metal layer 138 in the carrier substrate 134 is opaque to the electromagnetic disturbance radiation in general. The protection structure 140 with the layer-shaped embodiment on the sidewall region 120-2 of the integrated circuit, which is formed into the material of the carrier substrate 134 as far as the metallization structure 138 arranged there, can provide effective electromagnetic shielding of the side region 120-2 and the lower side 120-3 of the integrated circuit arrangement 120. Further, the protection structure 140 with the layer-shaped embodiment illustrated in FIG. 8a can be embodied on the base region 120-3 of the integrated circuit device 120, adjacent to the housing, as an effective electromagnetic shield on the lower side of the integrated circuit device 120.

According to exemplary embodiments, the protection structure 140, embodied as a protection layer, according to configurations F and G can be embodied to be reflective for the predetermined frequency range of the disturbance radiation, i.e., as metal layer or a Bragg reflector, for example, or embodied to be absorbent for the frequency range of the disturbance radiation, e.g., in the form of the disturbance-radiation-opaque silicone material, as illustrated in FIGS. 8a-8b in exemplary fashion.

Further, the layer-shaped protection structure 140 according to a configuration F can be embodied laterally into the material of the carrier substrate 134 and, for example, as far as the metallization plane 138 on the sidewall region 120-2 of the integrated circuit device 120. This configuration F of the layer-shaped protection structure 140 on the sidewall region 120-2 of the integrated circuit device 120 can be obtained by virtue of adding a depression or a groove into the carrier substrate 134 or the solder mask, on which the integrated circuit device 120 (ASIC) is arranged or which surrounds the integrated circuit device 120 (ASIC), and so the protection structure 140 embodied as a protection layer can extend on the side face 120-2 of the integrated circuit device 120 as far as the conductive layer 138 in the carrier substrate 134, as illustrated in FIG. 8b.

Now, a further exemplary embodiment of the protection structure 140 according to configuration "H" is described in exemplary fashion below on the basis of FIGS. 9a-9b, which are in the form of a schematic diagram in a cross-sectional view of the MEMS sensor 110.

Figure 9A:
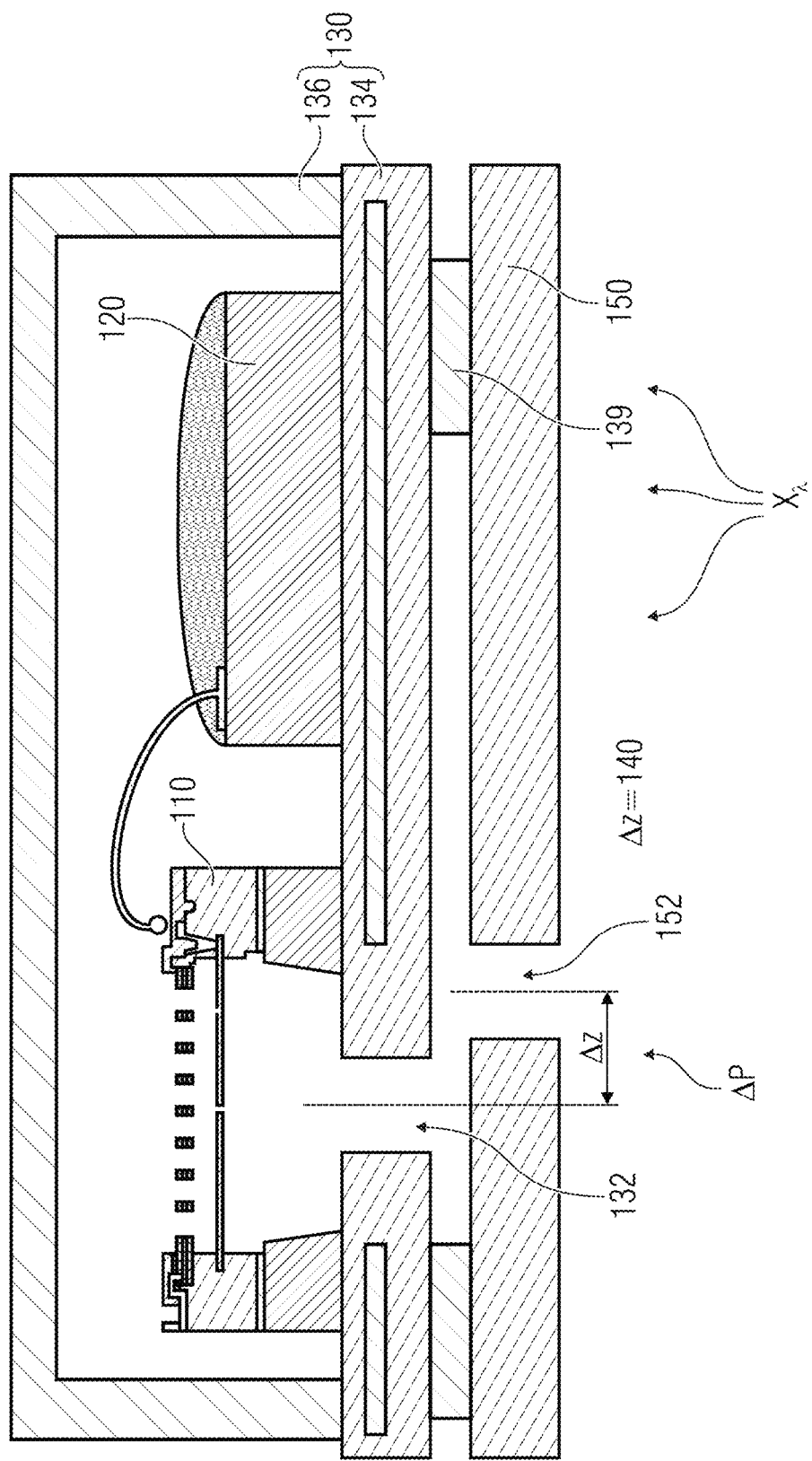
FIGS. 9a-9b in each case show a schematic diagram in a cross-sectional view of a MEMS sensor with a protection structure according to a configuration H as per one exemplary embodiment.
Figure 9B:
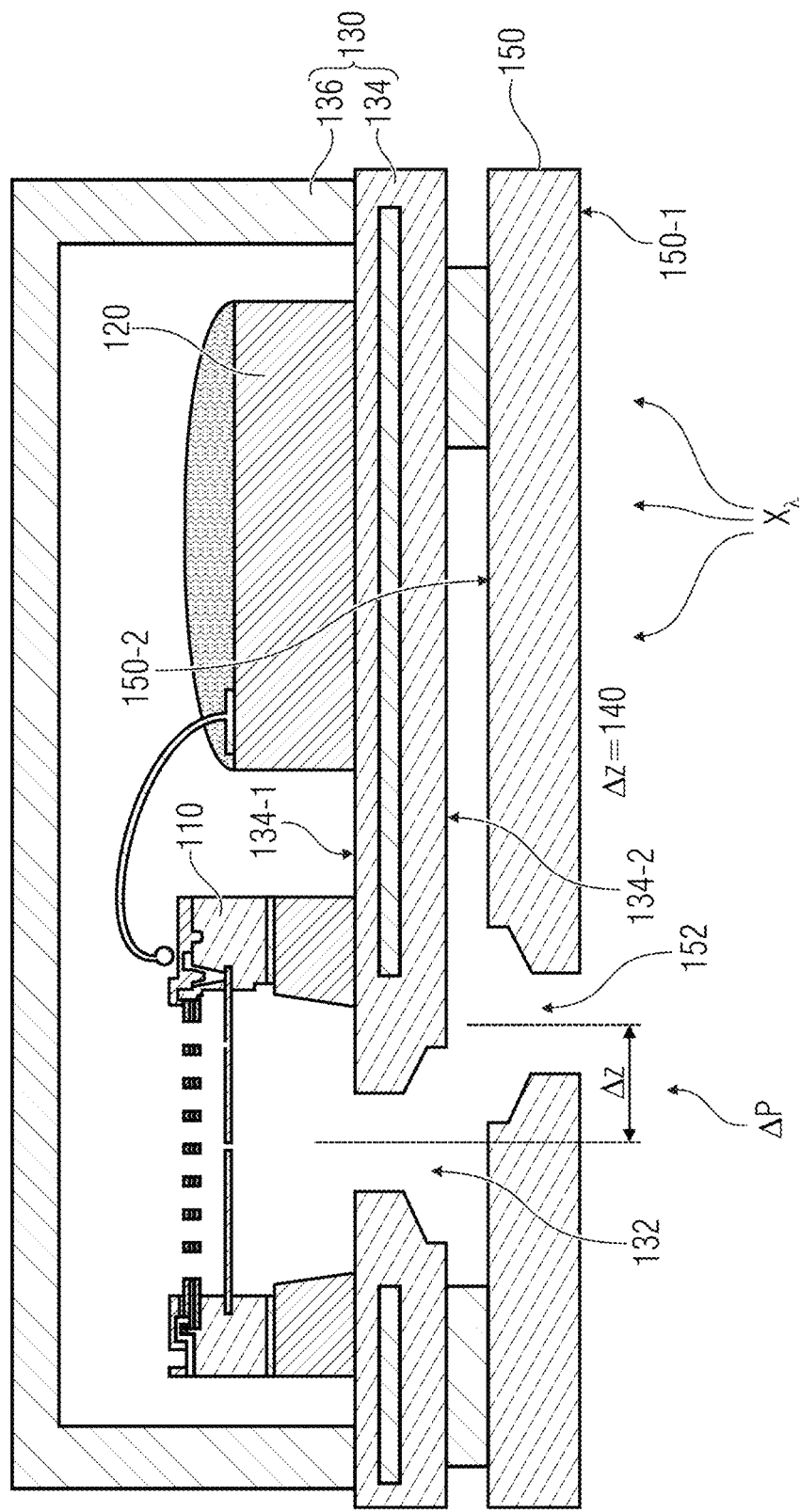

As illustrated in FIGS. 9a-9b, the MEMS sensor 100, at the carrier substrate 134 of the housing 130, is mechanically and optionally electrically coupled to a further carrier board 150, wherein the carrier board 150 has a sound port 152. As illustrated in FIGS. 9a-9b, the sound port 152 of the carrier board 150 is arranged laterally offset (parallel to the main surface 134-1 of the carrier substrate 134) by the distance $\Delta z$ from the sound port 132 in the carrier substrate 134 of the housing 130 in order to provide the protection structure 140 as an "indirect" sound path into the interior volume V of the MEMS sensor 100 through the carrier board 150 and the carrier substrate 134. As a result of the lateral offset $\Delta z$ of the port 152 in the carrier board 150 in relation to the sound port 132 of the housing 130, the direct disturbance radiation access (light access) into the interior volume of the housing 130 can be blocked, while the interior volume $V_1$ of the housing 130 remains acoustically open or accessible to the sound pressure changes $\Delta P$. The carrier board 150 and the carrier substrate 134 can consequently have off-centered sound ports 132, 152 for blocking direct disturbance radiation into the interior volume $V_1$, as illustrated in FIGS. 9a-9b.

As illustrated further in FIG. 9b, the sound ports 132, 152 of the carrier substrate 134 and of the carrier board 150 that are arranged off center in relation to one another can have a conical, i.e., widening, embodiment (e.g., in a direction toward one another). As illustrated in FIG. 9b, the sound port 152 of the carrier board 150 has a conical cross section, i.e., widening cross section, from the exterior surface region 150-1 to the second interior surface region 150-2, while the sound port 132 in the carrier substrate 134 has a conical cross-sectional profile, i.e., a widening cross-sectional profile, proceeding from the first surface region 134-1 adjacent to the interior volume V in the direction of the second surface region 134-2. Improved airflow and hence an improved transmission of the sound pressure change $\Delta P$ to the front volume $V_1$ in the housing 130 of the MEMS sensor 100 can be achieved by the conical configuration of the sound ports 132, 152 in the carrier substrate 134 and carrier board 150.

Optical properties of materials, such as absorbing materials, for example, which can be used in exemplary fashion for the protection structure 140, which has an embodiment opaque to electromagnetic disturbance radiation, are discussed below. According to exemplary embodiments, the MEMS sensor 100 has a protection structure 140, which is embodied to at least reduce a penetration of electromagnetic disturbance radiation $X\lambda$ with a wavelength in a range $\Delta\lambda$ between 10 nm and 20 µm into the interior volume V through the sound port 132 and/or at least reduce a propagation of the electromagnetic radiation $X\lambda$ in the interior volume V. An absorbing layer or protection structure 140 can have a disturbance-radiation-opaque or absorbent material, for example.

According to one exemplary embodiment, the protection structure 140 can have an absorbent layer material which has a high light-blocking coefficient and a low reflection coefficient such that, for example, it is possible to avoid a plurality of light reflections in the back volume or in the back volume of the MEMS component. "Super-black" surfaces, such as, for example, etched nickel-phosphor-based coatings or carbon-nanotube-based layers, such as e.g. vantablack, can be used, for example, for such applications according to the present concept. The light absorption of such coating materials substantially exceeds a value of 99% at all angles of incidence of the electromagnetic disturbance radiation. By way of example, typical thicknesses of such coating layers or layer materials are below 10 µm, for example 0.1 to 10 µm, and can be applied to practically any surface material. Further, polymer materials that can be processed further or technically modified by virtue of particle filler materials, such as, e.g., ferrite grains or carbon, being introduced into the polymer matrix in order to set the optical properties of the coating of the desired wavelengths, i.e., for example, in the relevant wavelength range Δλ of the electromagnetic disturbance radiation Xλ, can be used as absorbent layer materials for the protection structure 140.

Figure 10A:
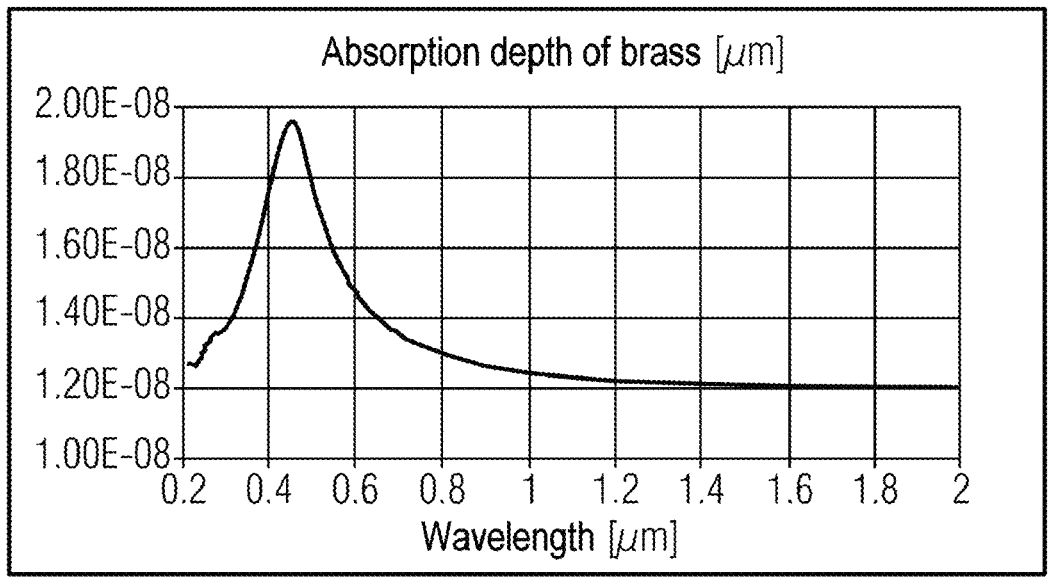
FIG. 10a-10f show a plurality of graphical illustrations of the optical properties of different materials for the protection structure according to one exemplary embodiment.
Figure 10B:
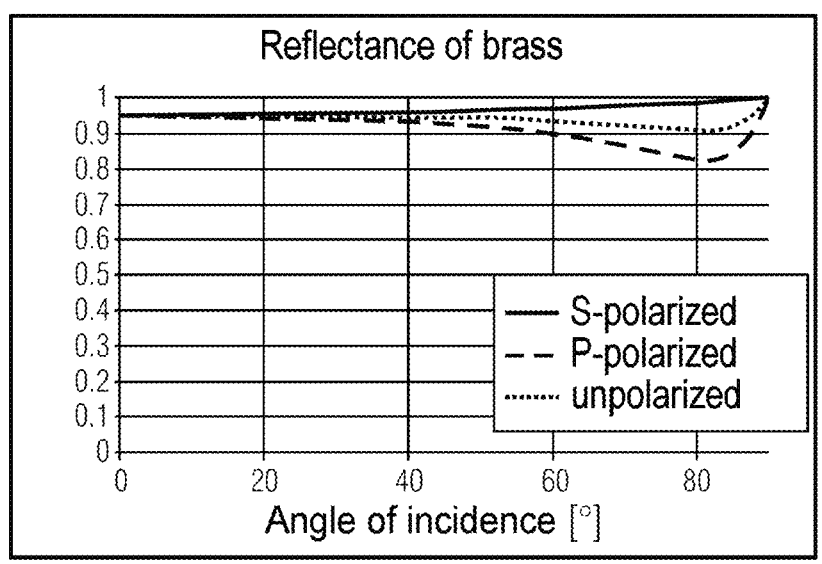

The graphical illustrations of FIGS. 10a and 10b illustrate the absorption depth and the reflectance of brass in an exemplary manner, which can be used, for example, as covering or capping material for the covering element 136 of the housing 130. Even though brass material has high light absorption properties (see FIG. 10a), brass material further also has a very high reflectance of, e.g., approximately 90% (see FIG. 10b), which, for example, may cause interfering multiple reflections of the disturbance radiation, e.g., light, into the back volume or within the back volume of the MEMS component 100.

Figure 10C:
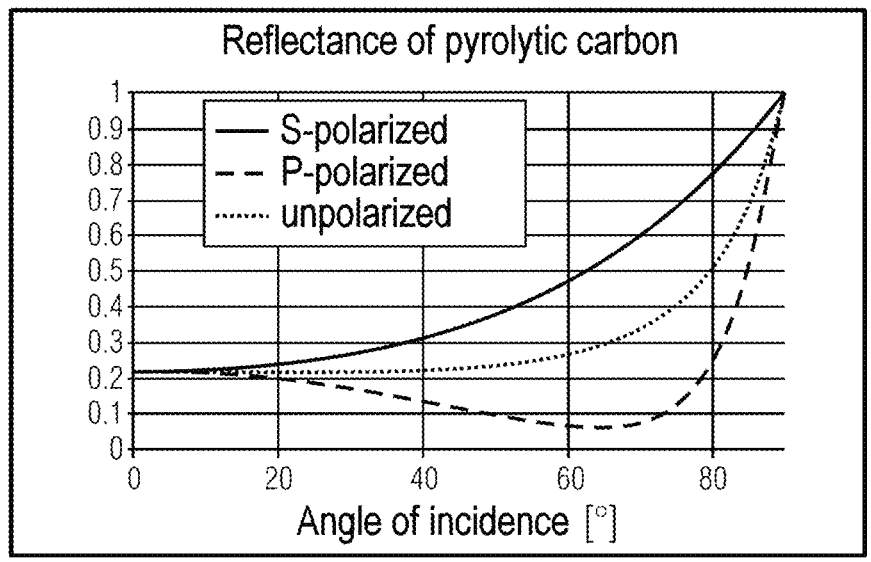
Figure 10D:
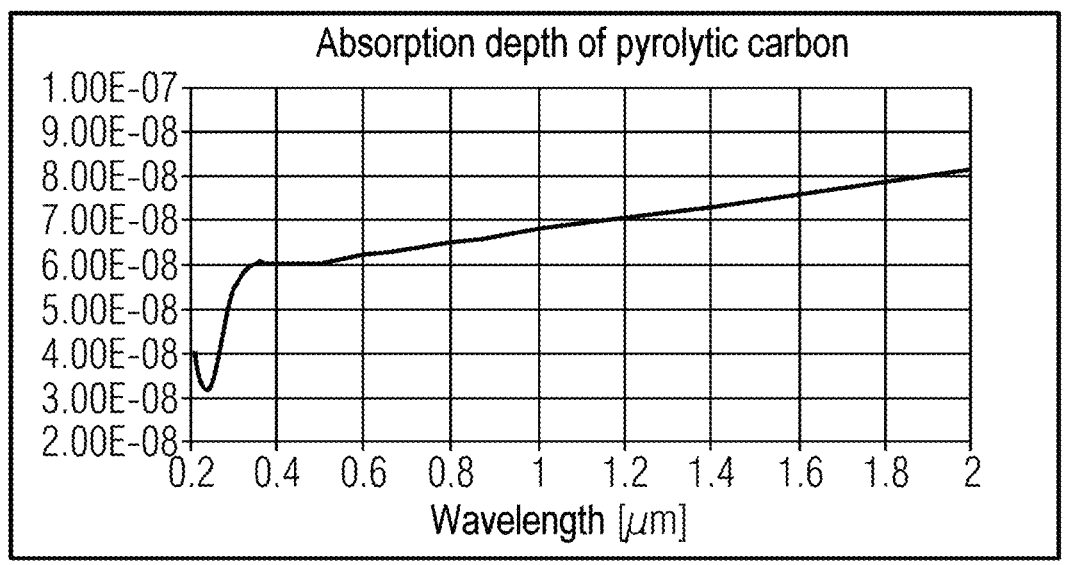
Figure 10E:
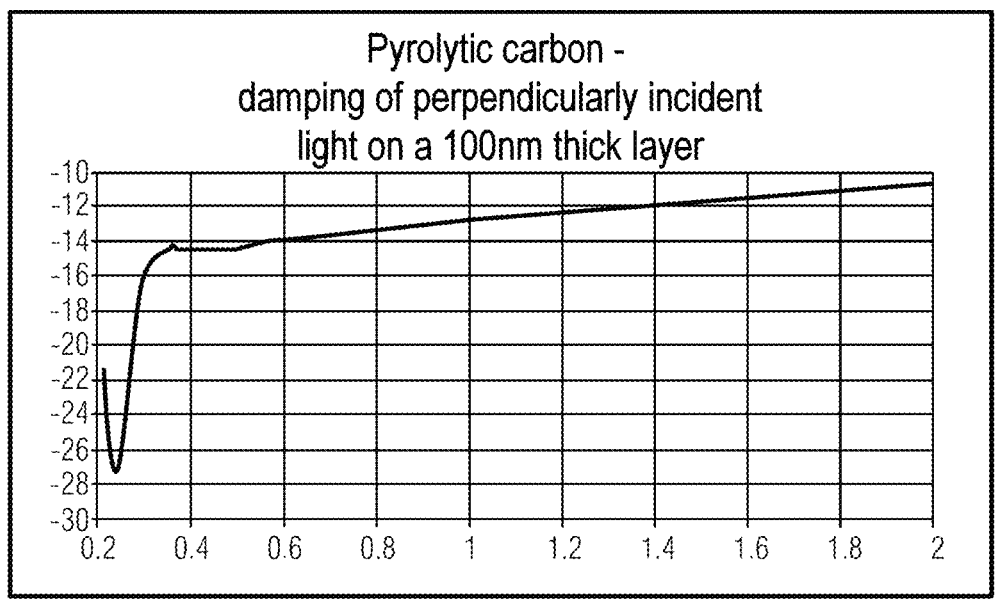
Figure 10F:
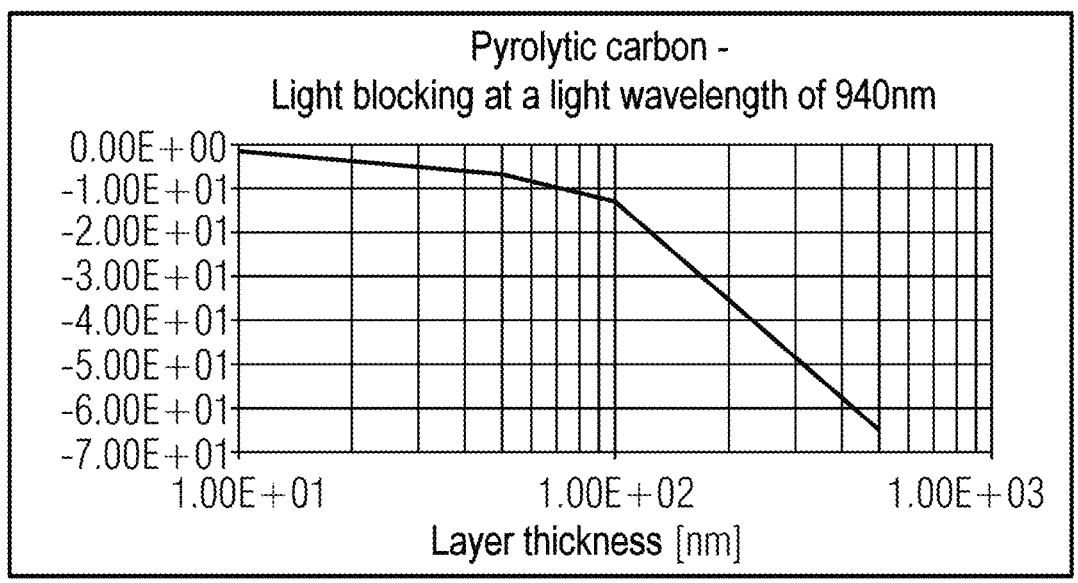

According to one exemplary embodiment, pyrolytic carbon, for example, can be used as layer material of the layer structure 140, with FIGS. 10c-10f showing different optical parameters of this material in exemplary fashion for the purposes of optimizing the coating material of the layer structure 140 according to one exemplary embodiment. By way of example, FIG. 10c shows a reflectance of pyrolytic carbon as a function of the angle of incidence of the electromagnetic disturbance radiation, with a distinction being made between S-polarized light, P-polarized light and unpolarized light. Figure bod plots the absorption depth of pyrolytic carbon against the wavelength. FIG. 10e shows the damping of perpendicularly incident light on a 100 nm thick layer made of pyrolytic carbon. FIG. 10f shows the light blocking of pyrolytic carbon at a light wavelength of 940 nm.

As may be gathered from the graphical illustrations in FIGS. 10c-10f, pyrolytic carbon, in the relevant wavelength range Δλ of electromagnetic disturbance radiation Xλ, exhibits both a good light absorption behavior and a lower reflectance at different angles of incidence of the electromagnetic disturbance radiation or light. Further, what can be gathered from the graphical illustrations of FIGS. 10e-10f is that a layer thickness of the order of a few μm, for example in a range of 1 to 10 μm or of 2 to 5 μm, or even smaller, e.g., in a range of 50 500 nm or 80 to 200 nm or approximately 100 nm, suffices to obtain almost complete damping of the incident light, which is not reflected by the layer material. In this context, reference is made to the fact that the graphical illustrations of the damping in FIGS. 10c-10f relate to the non-reflective component of the incident light of the incident electromagnetic disturbance radiation.

The different configurations of the protection structure 140 illustrated above on the basis of FIGS. 1 to 10f facilitate an effective protection in relation to electromagnetic disturbance radiation or in the wavelength range Δλ between 10 nm and 20 μm such that it is possible to obtain MEMS sensors 100, such as, e.g., MEMS sound transducers or MEMS microphones, that are insensitive to electromagnetic disturbance radiation.

While exemplary embodiments are suitable for various modifications and alternative forms, accordingly exemplary embodiments of same are shown by way of example in the figures and described thoroughly here. It goes without saying, however, that the intention is not to limit exemplary embodiments to the specific forms disclosed, rather on the contrary the exemplary embodiments are intended to cover all modifications, counterparts and alternatives that fall within the scope of the disclosure. Throughout the description of the figures, identical reference signs refer to identical or similar elements.

It goes without saying that if one element is designated as "connected" or "coupled" to another element, it can be connected or coupled directly to the other element or intermediate elements can be present. If, in contrast, one element is designated as "connected" or "coupled" "directly" to another element, no intermediate elements are present. Other expressions used for describing the relationship between elements should be interpreted in a similar way (e.g. "between" vis-à-vis "directly between", "adjacent" vis-à-vis "directly adjacent", etc.). Furthermore, the formulation "at least one" element should be understood to mean that one element or a plurality of elements can be provided.

Although some aspects have been described in association with a MEMS sensor or MEMS assembly, it goes without saying that some aspects also constitute a description of the corresponding production method with corresponding method steps for producing a MEMS assembly. In this regard, providing a block or a component should also be understood as a method step or a feature of a method step of a corresponding method. Some or all of the method steps can be carried out by a hardware apparatus (or using a hardware apparatus), such as using a microprocessor, a programmable computer or an electronic circuit. In some exemplary embodiments, some or a plurality of the most important method steps can be carried out by such an apparatus.

In the detailed description above, in some instances different features have been grouped together in examples in order to rationalize the disclosure. This type of disclosure ought not be interpreted as the intention that the claimed examples have more features than are expressly indicated in each claim. Rather, as represented by the following claims, the subject matter can reside in fewer than all features of an individual example disclosed. Consequently, the claims that follow are hereby incorporated in the detailed description, wherein each claim can be representative of a dedicated separate example. While each claim can be representative of a dedicated separate example, it should be noted that although dependent claims refer back in the claims to a specific combination with one or more other claims, other examples also comprise a combination of dependent claims with the subject matter of any other dependent claim or a combination of each feature with other dependent or independent claims. Such combinations shall be encompassed, unless an explanation is given that a specific combination is not intended. Furthermore, the intention is for a combination of features of a claim with any other independent claim also to be encompassed, even if this claim is not directly dependent on the independent claim.

Although specific exemplary embodiments have been illustrated and described herein, it will be apparent to a person skilled in the art that a multiplicity of alternative and/or equivalent implementations can be substituted for the specific exemplary embodiments shown and illustrated there, without departing from the subject matter of the present application. This application text is intended to cover all adaptations and variations of the specific exemplary embodiments described and discussed herein. Therefore, the present subject matter of the application is limited only by the wording of the claims and the equivalent embodiments thereof.

What is claimed is:
1. A MEMS sensor comprising:
   a housing enclosing an interior volume, wherein the housing comprises a substrate having an access port to the interior volume, and a covering element attached to the substrate;

a MEMS component in the interior volume of the housing; and a protection structure comprising a first protection structure element covering the access port, wherein the first protection structure element is in contact with an external surface of the substrate, a second protection structure element extending across the access port, wherein the second protection structure element is embedded in the substrate, and a third protection structure element covering the access port, wherein the third protection structure element is in contact with an internal surface of the substrate, and wherein the first protection structure element, the second protection structure element, and the third protection structure element comprise the same material.

2. The MEMS sensor as claimed in claim 1, wherein the housing is arranged on a carrier board comprising a further access port, wherein the further access port is arranged with a lateral offset to the access port of the substrate.

3. The MEMS sensor as claimed in claim 1, wherein the first protection structure element, the second protection structure element, and the third protection structure element each comprises a layer-shaped protection structure element.

4. The MEMS sensor as claimed in claim 1, wherein the first protection structure element, the second protection structure element, and the third protection structure element are parallel.

5. The MEMS sensor as claimed in claim 1, further comprising a fourth protection structure element affixed to the MEMS component.

6. The MEMS sensor as claimed in claim 5, wherein the fourth protection structure element is parallel to at least one of the first, second, and third protection structure elements.

7. The MEMS sensor as claimed in claim 5, further comprising a fifth protection structure element affixed to an internal surface of the covering element.

8. The MEMS sensor as claimed in claim 7, wherein the fifth protection structure element is parallel to a least one of the first, second, and third protection structure elements.

9. The MEMS sensor as claimed in claim 7, further comprising an integrated circuit in the interior volume of the housing.

10. The MEMS sensor as claimed in claim 9, further comprising a sixth protection structure element affixed to a sidewall of the integrated circuit.

11. The MEMS sensor as claimed in claim 10, further comprising a seventh protection structure element between the integrated circuit and the substrate.

* * * * *